(12) United States Patent  (10) Patent No.: US 6,277,501 B1
Fujikawa  (45) Date of Patent: Aug. 21, 2001

(54) SILICON EPITAXIAL WAFER AND METHOD FOR MANUFACTURING THE SAME

(75) Inventor: Takashi Fujikawa, Kashima (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/230,684

(22) PCT Filed: Jul. 25, 1997

(86) PCT No.: PCT/JP97/02580

§ 371 Date: Feb. 26, 1999

§ 102(e) Date: Feb. 26, 1999

(87) PCT Pub. No.: WO98/05063

PCT Pub. Date: Feb. 5, 1998

(30) Foreign Application Priority Data

Jul. 29, 1996 (JP) .................................................... 8-216583
Feb. 17, 1997 (JP) .................................................... 9-049709

(51) Int. Cl.$^7$ .................................................... B32B 15/00
(52) U.S. Cl. .................. 428/641; 428/446; 428/447; 428/688; 428/930; 438/460; 438/959; 438/974; 156/60; 117/13; 117/19
(58) Field of Search .................................... 428/641, 688, 428/446, 447, 930; 148/DIG. 60; 438/300, 222, 460, 974, 959, 471; 156/60; 117/13, 19

(56) References Cited

U.S. PATENT DOCUMENTS 5,882,401 * 3/1999 Maruyama et al. .................... 117/97

FOREIGN PATENT DOCUMENTS 0 137 209    4/1985 (EP) .
59-94809    5/1984 (JP) .
63-227026    9/1988 (JP) .

* cited by examiner

Primary Examiner—Deborah Jones
Assistant Examiner—Abraham Bahta
(74) Attorney, Agent, or Firm—Breiner & Breiner, L.L.C.

(57) ABSTRACT

The present invention has as an objective providing a silicon epi-wafer, and a manufacturing method therefor, which simplifies processing as much as possible in an attempt to lower the cost of an epi-wafer, and which is capable of manifesting a sufficient IG effect even in low-temperature device fabrication processing of under 1080° C. in an epi-wafer, and furthermore, in device processing, which enhances gettering capabilities for a variety of impurities in wafer device processing, without performing, following wafer slicing, any process from which an EG effect can be anticipated. As for the silicon single crystal, which is grown via the CZ method so as to make the oxygen concentration relatively high, and to intentionally make the carbon concentration high, outstanding gettering capabilities are manifested in the wafer itself, without performing EG processing. And, in accordance with suitably controlling oxygen concentration and carbon concentration while pulling a single crystal, and performing short-duration annealing at a low temperature after silicon wafer slicing, [the present invention], in addition to furnishing IG capabilities, is capable of reducing the number of processes by not performing any of the various complex EG processes performed following conventional silicon wafer formation, strives to lower costs, makes possible the granting of IG capabilities, which are generated in low-temperature device processing that uses an epi-wafer, and, since EG is not needed even when two-side mirror finishing is required to realize high-precision planarity, makes possible the manufacture of a substrate capable of measures designed to increase precision.

4 Claims, 15 Drawing Sheets

SILICON EPITAXIAL WAFER AND METHOD FOR MANUFACTURING THE SAME

FIELD OF THE INVENTION

The present invention relates to a silicon epitaxial wafer and a manufacturing method therefor, which involves the improvement of a silicon epitaxial wafer (hereinafter referred to as an epi-wafer) that has on a prescribed surface a gas-phase-grown epitaxial layer, and is provided for the fabrication of LSI and VLSI semiconductor devices and the like, and which is capable of capturing inside the wafer a variety of impurities acquired during various heat treatments in LSI, VLSI and other device fabrication processes, can enhance the gettering capabilities of the wafer without performing any process that can be expected to produce a post-wafering EG (Extrinsic-Gettering) effect in the wafer, and is capable of exhibiting a sufficient IG (Intrinsic-Gettering) effect even in a low-temperature device fabrication process of under approximately 1080° C., in accordance with manufacturing, whereby a wafer is sliced from the silicon single crystal ingot, which is pulled by controlling the oxygen concentration of the single crystal to a prescribed level, and at the same time intentionally controlling the carbon concentration to a prescribed high level, when a silicon single crystal is pulled using the Czochralski method, or the magnetic Czochralski method (hereinafter referred to simply as the CZ method), undergoes wafer processing, and, as likely as not, is subjected to further low-temperature annealing for a predetermined short period of time, followed by mirror-finish polishing, and epitaxial growth.

DESCRIPTION OF THE PRIOR ART

In the fabrication of LSI, VLSI and other device elements, generally, a silicon wafer sliced from a single-crystal ingot of silicon grown using the CZ method is mainly utilized as the substrate therefor. In recent years, the increase in the degree of integration of semiconductor devices in line with the raising of device chip performance, and the scaling down of device structures has been remarkable, rapid progress has been made in achieving high value added devices, and manufacturing costs have also risen abruptly in line therewith.

Under such conditions, the demand to improve the yield of final device products has become stronger than ever before. Meanwhile, the silicon wafer, which is the substrate of the device wafer, must of course possess high-quality crystallinity and electrical properties capable of coping with high density devices, and the supply of low-cost silicon wafers is also becoming an urgent task.

As for the silicon wafers used in large numbers in the above-mentioned application, in the past, after undergoing wafering by being sliced from a single-crystal ingot of silicon pulled using the CZ method, it was common for a wafer to undergo mirror-finish polishing on the front side only after it had been subjected to EG processing, for example, PBS (Poly-Backseal), BSD (Backside-Damage), excimer laser or other processing, that could be expected to produce an EG effect on the backside.

One method for solving the problem of lowering costs, that is, as a method for reducing the number of processes, various wafer processing methods are being studied to replace the conventional EG-processed wafer mirror-finished on one side with wafers that are not subjected to EG processing and undergo mirror-finishing on both the front and back sides, that is, non-EG-processed wafers mirror-finished on both sides.

That is, as a result of being able to omit the backside EG treatment process, which uses the BSD method and PBS growth that cause damage to a wafer backside by spraying it, for example, with an SiO2 polishing solution to capture various impurities in the device processing process, and of being able to omit the numerous front-end processes required to implement the processing thereof, it is possible to achieve large cost reductions that enable production processing costs to be reduced more than those for a conventional EG-processed wafer mirror-finished on one side. And at the same time, a wafer that is mirror-finished on both sides is also advantageous in that it can achieve higher precision planarity from the standpoints of warpage, flatness and other aspects of precision than a wafer that is mirror-finished on one side.

Similarly, another method for manufacturing a low-cost wafer is a method, which, relative to conventional EG-processed wafers that are mirror-finished on one side, is finished as a non-EG-processed wafer that is mirror-finished on one side, the backside of which wafer is not subjected to any sort of EG processing. That is, with regard to the backside of the wafer, which is not used to fabricate device elements, in accordance with using an etched (etched surface finish) wafer, which has not undergone EG processing, the BSD processing process can be omitted similar to the wafer mirror-finished on both sides.

Conversely, as for the device fabrication process, Fe, Ni, Cu and other heavy metal impurities are readily generated in the high temperature processes that are typical for D-RAM, and in accordance with these heavy metal impurities, impurity defects are formed in the wafer surface and near the wafer surface, causing the degradation of various device characteristics, and in turn lowering product yield. Consequently, to remove these heavy metal impurities from the surface and near surface regions, which comprise the device active region, various EG and IG impurity capturing (gettering) procedures, typified by the above-mentioned PBS, BSD and excimer laser, have often been utilized on the backsides of wafers in the past.

Since conventional high-temperature device processes have a relatively high Well-Drive process of between 1120° C. and 1220° C., oxygen precipitation, which is a cause of BMD, occurs relatively readily during device processing heat treatment, and because sufficient BMD are formed for gettering device impurities in the bulk inside a wafer, IG, such as N-IG (Natural-IG), which depends on EG, and DZ (Denuded Zone)-IG, have been widely utilized.

As for device processing of the future, it is clear that from now on progress will be made in lowering the temperature of processes that use design rule downscaling and high energy ion implantation in line with the move toward denser 256 MB, 1 GB integration, and in accordance with this lower temperature, the formation of BMD during device processing is expected to become difficult, making it impossible to achieve a sufficient IG effect.

In this way, although the amount of impurities generated in a device will be reduced somewhat in line with lowering the process temperature, it is believed that the generation of heavy metal impurities from high-energy ion implanting and the like will be hard to avoid, and that gettering technology will be essential.

Further, with regard to capturing heavy metal impurities using EG, it is inevitable that wafer precision, that is, high-precision planarity represented by flatness, warpage and the like, will be required more than ever for highly integrated devices of the future. In this case, if the high likelihood of the use of two-sided mirror-finished wafers capable of achieving high-precision planarity is taken into consideration, it is highly possible that EG-type gettering will not be applicable, and that it will become increasingly necessary to ensure gettering capabilities using IG.

Further, in the fabrication of a highly-integrated, high-performance device, high integrity is required of the crystalline quality characteristics and electrical quality characteristics of the wafer surface and near surface layer that correspond to the active electrical area, which affects device reliability and yields. In particular, the integrity of the surface and near surface of the wafer will obviously be required for wafers slated for high-performance, highly-integrated D-RAM semiconductor devices typical of the so-called personal computers and game machines, demand for which is expected to increase rapidly in the future.

Typical methods for solving this problem have coped by making the silicon wafer highly pure, and enhancing the integrity thereof so as to reduce the oxygen concentration $O_i$, which is incorporated into a wafer when the silicon single crystal is pulled, for example, by changing the $O_i$ $14\sim16\times10^{17}$ atoms/cm$^3$ (OLD ASTM method) criteria to $O_i$ $9\sim11\times10^{17}$ atoms/cm$^3$, and so as to reduce the carbon concentration $C_s$ as much as possible by making every effort to prevent the mixing into this silicon single crystal of carbon, which is an impurity element that is utilized as the material of a carbon crucible and carbon heater, and other peripheral auxiliary members when pulling a silicon single crystal, for example, so that in an FTIR measurement, the carbon concentration is less than $C_s$ $0.1\times10^{16}$ atoms/cm$^3$ (NEW ASTM method) (on the order of $10^{14}$ when viewed through a highly-sensitive radioactivation analysis system).

Recently, as the trend toward ever more densely-packed devices progresses, measures for reducing the carbon concentration $C_s$ thereof are being viewed as extremely important, and methods for enhancing surface integrity by keeping the oxygen concentration $O_i$ and carbon concentration $C_s$ low, and, in turn, suppressing the generation of BMD (Bulk-micro-defects), which exist in the surface and near surface and cause device failure, and secondary defects generated in line therewith, for example OSF (Oxidation-Induced-Stacking Fault) and the like, have been proposed.

However, it is fully anticipated that conventional methods alone for reducing oxygen and carbon concentrations such as these will not be able to cope with the higher-density, further downscaled device structures of the future. Accordingly, recently there has been a tendency to make frequent use of the epi-wafer as the wafer for D-RAM and other semiconductors.

That is, by comparison to a mirror-finished wafer, because the epitaxial layer of an epi-wafer has absolutely no device characteristic-degrading Grown-in defects (micro-defects generated in the process of pulling a silicon single crystal), extremely high quality surface integrity can be achieved. Further, it is also generally known that, when it comes to evaluating electrical characteristics, such as, for example, oxide layer breakdown voltage characteristics, which affect device characteristics, electrical characteristics, for example, the oxide layer breakdown voltage value, is greatly enhanced compared to a state in which there is no epitaxial layer.

Up until now, in contrast to mirror-finished wafers, the epi-wafer has not been used much outside of special device applications due to cost factors. But due to the extreme difficulty of completely removing Grown-in defects in mirror-finished wafers, the likelihood of epi-wafers coming into full-scale use for more highly-integrated next-generation (256MB, 1GB, and beyond) devices is extremely high, and for this reason, as for next-generation (12-inch) and beyond large-diameter silicon wafers, the likelihood that epi-wafers will come into widespread use as substrates for devices can also be said to be extremely high.

However, as mentioned above, in order for the epi-wafer, which is manufactured using as a substrate a lower-cost non-EG-processed wafer, that is, a two-sided mirror-finished wafer and a backside etched wafer, to be introduced into the device process, and to achieve high yields, it will be necessary to utilize some sort of method to furnish it with gettering capabilities for capturing impurities.

That is, silicon manufacturers and device manufacturers alike are working to make their manufacturing processes highly pure and highly clean, and the degree of in-process cleanness has been significantly improved compared to what it was in the past. But because of the use of diverse heat treatments that utilize various gas environments during the device manufacturing process, certain levels of a variety of impurity elements are inevitably generated. Consequently, there must be a mechanism that enables these impurity elements to be gettered in areas other than the wafer surface or near surface layers, which form the device active area.

Generally, as mentioned above, an EG treatment process is performed on the backside of an epi-wafer beforehand, during the wafer manufacturing process, to make [the wafer] gettering-capable for when impurities are generated within the device processing process. But to realize reduced production costs, as mentioned above, it is necessary to omit the backside EG treatment process. However, when the EG treatment process is omitted, naturally, gettering capabilities relative to impurities generated within the device processing process are missing.

For example, in the case of a low-resistance product, which contains B (boron) in a high concentration within the wafer, this B possesses a gettering-capable mechanism, interacts with Fe (iron), for example, to form an Fe and B pair (Fe—B), and possesses a function that enables gettering in accordance therewith. However, there is no such Fe—B interaction with impurity elements such as Ni (nickel), Cu (copper) and the like in high concentrations of $1\times10^{12}$ atoms/cm$^2$, for example, giving rise to a lack of gettering capabilities. The result thereof is deficiencies such as the degradation of device characteristics, and the reduction of device yields.

As mentioned above, in a high-integration low-temperature process, since an extremely high quality device active area is essential, an epi-wafer is used, and to achieve high-precision planarity, there is a high likelihood of a two-side mirror-finished wafer being used as the substrate therefor. Further, IG(BMD) is necessary to getter the various impurities generated in the device.

However, when an epitaxial layer is grown on a silicon wafer substrate with a resistivity value of 0.1 Ω·cm or larger, due to the influence of the heat history in accordance with the sudden rise in temperature associated with a process in the epitaxial growth process in which the temperature is increased, and a high-temperature pre-treatment process, a phenomenon occurs wherein the oxygen precipitates that are the source of BMD are shrunk or annihilated, and thereafter, since oxygen precipitation does not occur even when [the wafer] is subjected to a low-temperature device process, impurities generated by the device cannot be gettered, and as a result thereof, there occurs a degradation of device characteristics, and a reduction of product yields.

Further, it has been ascertained that even if a high-oxygen-content substrate (in which BMD is readily formed) not ordinarily used as a device substrate is utilized, not much BMD, the gettering source, is formed in accordance with carrying out epitaxial growth via a low-temperature process, and the IG effect cannot be expected.

Accordingly, a method in which BMD is ensured in accordance with a method wherein, following epitaxial growth, [a wafer] is subjected to low-temperature annealing for a long period, that is, it is either heated at between 650~900° C. for from 4~20 hours, or is heated by gradually increasing the temperature from 650 to 900° C., is reported in Japanese Patent Laid-open No. 63-198334. But due to the long annealing time, costs are huge, and in accordance with performing this low-temperature annealing after epitaxial growth, various problems can be expected from the standpoint of production yields, brought on by the ready occurrence of defects due to boat scratches and the generation of particulates during heat treatment, and handling problems.

Japanese Patent Laid-open No. 63-227026 reports a method, in which BMD is ensured by performing a 2-stage heat treatment comprising low-temperature annealing+medium-temperature annealing after growing an epitaxial layer of a limited thickness of just 5~50 μm on a wafer that has been doped with a high concentration of carbon (0.5~15 ppma: since the conversion factor is not provided in this Official Gazette, a definite value is not clear, but if this value is inferred from the figure for oxygen concentration in the detailed description, around $2.5 \times 10^{16}$ atoms/cm$^3$~$7.5 \times 10^{17}$ atoms/cm$^3$ can be assumed) during crystal pulling.

However, even in a method that heightens the concentration of carbon, as shown in the embodiment, a long 8 hours and 30 minutes of heat treatment is required, costs are incurred, and, consequently, productivity is low. In accordance with implementing heat treatment following epitaxial growth, various problems can be expected from the standpoint of production yields, brought on by the ready occurrence of defects due to boat scratches and the generation of particulates during heat treatment, and handling problems.

Japanese Patent Laid-open No. 3-50186 reports a method, in which BMD is ensured by heat treatment at 750~900° C. (however, the time range is not specified) prior to epitaxial growth, but with regard thereto, if estimated based on FIGS. 1 and 4 of the same Official Gazette, it can be estimated that a long heat treatment in excess of at least 4 hours is required, making this is a problem from the aspect of productivity.

Japanese Patent Laid-open No. 8-250506 proposes a method, in which epitaxial growth is performed after first carrying out either 1-stage or 2-stage low-temperature annealing, and next, the maintenance thereof in a medium-temperature environment prior to epitaxial growth. But with this method, productivity clearly declines, and under the present circumstances, in which the low-cost, stable manufacture of epi-wafers is required, this method also has problems.

For the epi-wafer, which is viewed as promising as a substrate capable of handling highly-integrated next-generation devices, it is difficult to achieve a sufficient IG effect with a low-temperature device process, and, as described above, although various approaches have been proposed, each suffers from problems from the standpoints of productivity, costs, and production yields.

DISCLOSURE OF THE INVENTION

An objective of the present invention is to provide an epi-wafer, and a manufacturing method therefor, which simplifies processing as much as possible in order to lower epi-wafer costs, and which improves gettering capabilities relative to various impurities during wafer device processing without performing any treatment that could be expected to result in a post-wafering EG effect.

Further, with the foregoing epi-wafer gettering (IG) problems in view, another objective of the present invention is to provide a silicon epi-wafer, and a manufacturing method therefor, which simplifies processing as much as possible in order to lower costs, and is capable of demonstrating a sufficient gettering effect (IG) even in a low-temperature device manufacturing process of less than 1080° C. in epi-wafer device processing, without performing any treatment that can be expected to result in a post-wafering EG effect.

The inventor did studies on furnishing an as-pulled silicon wafer with gettering capabilities, having as an object a method that enables wafer gettering capabilities to be improved, without performing any treatment that could be expected to result in a post-wafering EG effect. As a result, it was learned that, for a silicon single crystal, which was grown using the CZ method so as to make the oxygen concentration relatively high, and to intentionally make the carbon concentration high, outstanding gettering capabilities were exhibited by the wafer itself, without carrying out an EG treatment, and the present invention was accomplished.

Further, the inventor conducted various studies on furnishing an as-pulled silicon wafer itself with gettering capabilities, having as an objective the manufacture of an epi-wafer capable of demonstrating a sufficient gettering effect (IG) even in a low-temperature device manufacturing process of under roughly 1080° C., without performing any treatment that could be expected to result in a post-wafering EG effect. As a result, it was learned that after slicing into silicon wafers a silicon single crystal, which was grown using the CZ method so as to [achieve] a specified oxygen concentration, and to intentionally make the carbon concentration high, in accordance with annealing at low-temperatures for a short duration, even an epi-wafer exhibited sufficient gettering (IG) capabilities, even in low-temperature device processing, without carrying out an EG treatment, and the present invention was accomplished.

More specifically, in general, numerous oxygen precipitate nuclei, which are capable of constituting sources for capturing impurity elements, are scattering inside a silicon single crystal grown using the CZ method. These oxygen precipitate nuclei are introduced during the process of growing a silicon single crystal, and the greater the oxygen concentration, the more numerous the scattered oxygen precipitate nuclei. Conversely, with regard to carbon, although the mechanism therefor is not clear, the higher the carbon concentration, the more readily precipitation occurs, and because the covalent radius of a carbon atom is nearly 40 percent smaller than the covalent radius of a silicon atom, it is believed that crystal lattice strain could occur in accordance with this covalent radius variance, but nothing definite is known.

With regard to carbon, it possesses a so-called catalytic effect, a precipitation promoting action, which enables the fostering of oxygen precipitation, and the greater the carbon concentration, the larger the achievable oxygen precipitation fostering effect. Utilizing a silicon single crystal that was pulled at a specified oxygen concentration while intentionally controlling the carbon concentration to make it high during the growth of a silicon single crystal via the CZ method, after slicing the silicon wafers, annealing was performed for a short duration at a low temperature, and thereafter, in accordance with growing an epitaxial layer on either a two-sided mirror-finished wafer, or a one-sided mirror-finished wafer, without performing any EG treatment process, and manufacturing an epi-wafer, high-precision planarity was achieved at a low-cost, and it was possible to ensure BMD nuclei that were not annihilated even when subjected to the heat history at epitaxial growth. As a result thereof, it was possible to furnish gettering capabilities (IG) relative to the various impurities in device processing, and it was possible to achieve, even in a low-temperature device process, an epi-wafer that possesses sufficient gettering capabilities (IG).

BEST MODE FOR CARRYING OUT THE INVENTION

In the present invention, a silicon single crystal, which is the target [of the present invention], is characterized in that it is grown by the known CZ method, and is not subjected to any treatment from which an EG effect can be expected.

A first invention is characterized in that it improves the gettering capabilities of a wafer, which has been polished on either one side or two sides, and on which an epitaxial layer has been grown, without performing any treatment that can be expected to result in a post-wafering EG effect, by controlling via a known control method the oxygen concentration Oi in the range of $12\sim27\times10^{17}$ atoms/cm$^3$, and simultaneously controlling the carbon concentration (Cs) in the range of $0.5\sim32\times10^{16}$ atoms/cm$^3$ by the intentional addition of pure carbon, while growing a silicon single crystal.

Therefore, no treatment that can be expected to result in an EG effect is performed on the targeted silicon single crystal, but, as shown in the following embodiment, the joint use of an IG method, such as gettering, whereby an Fe—B pair is formed via B doping, is desirable for improving heavy metal gettering capabilities. Further, it was ascertained that the same operating effect of the present invention also worked on a silicon single crystal which underwent P doping similar to the B doping.

Further, a second invention is characterized in that it is capable of improving the gettering capabilities of an epi-wafer, which has been polished to a mirror finish on either one side or two sides, and on which an epitaxial layer has been grown, even in the low-temperature device processing thereafter, without performing any treatment that can be expected to result in an EG effect, by controlling via a known control method the oxygen concentration in the range of $12\sim18\times10^{17}$ atoms/cm$^3$, and at the same time intentionally controlling the carbon concentration in the range of $0.3\sim2.5\times10^{16}$ atoms/cm$^3$, while growing the silicon single crystal, and, after slicing into silicon wafers, by performing annealing for a short duration of greater than 15 minutes but less than 4 hours at a temperature of between 600~900° C.

Figure 15:
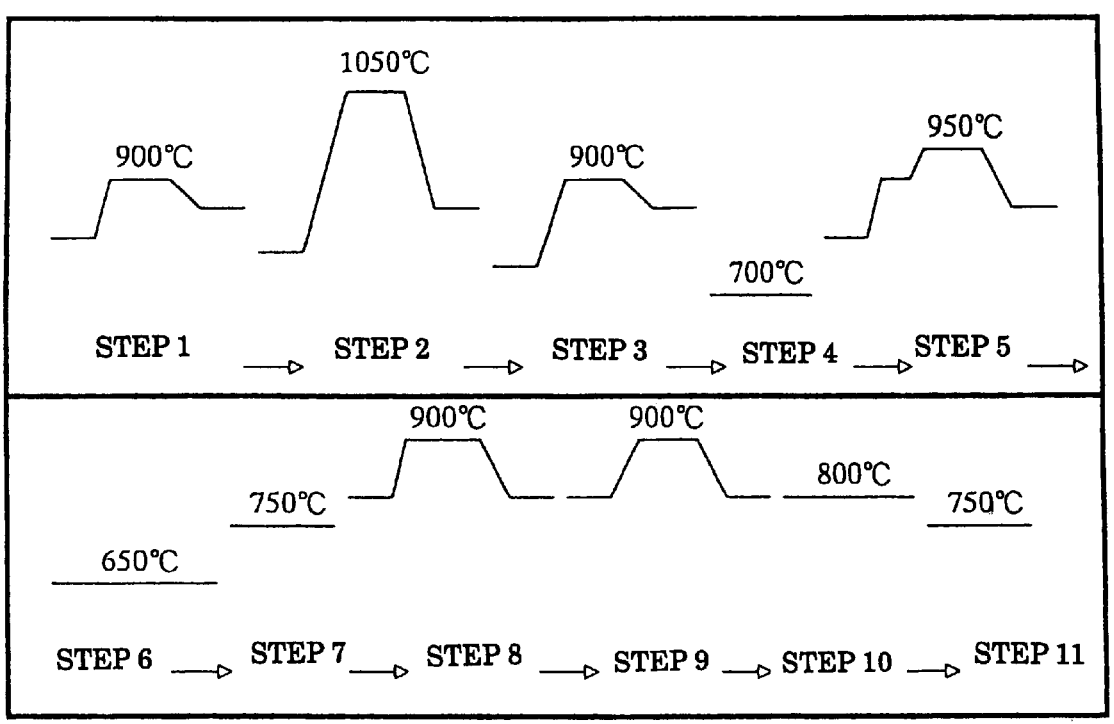
FIG. 15 is a low temperature-type heat treatment heat pattern diagram, which is equivalent to device processing.

The second invention clarifies the fact that a sufficient gettering effect (IG) can be achieved in accordance with the above-described method even in an epi-wafer with a resistivity value of more than 0.1 Ω·cm, even under heat treatment conditions equivalent to low-temperature device processing of a pattern like that shown in FIG. 15, and is characterized in that pure carbon is purposely added during pulling, and after slicing into silicon wafers, annealing is performed for a short duration at a low temperature. [This second invention] is a novel invention that enables the production of a low-cost epi-wafer, is fully applicable to low-temperature device processing as well, and differs from all the above-described conventional processing methods as to oxygen concentration, carbon concentration, and resistivity value of the silicon single crystal, and the heat treatment implementation process, and temperature, duration thereof.

The above-described present invention has as an objective improving gettering capabilities relative to the various impurities associated with wafer device processing, and providing a wafer at low cost by simplifying processing as much as possible by not performing any treatment that can be expected to result in a post-wafering EG effect. [The present invention] provides an epi-wafer, on which a film is formed on a required surface via epitaxial growth for supply to high-integration device processing, and provides as an epi-wafer a backside etched wafer, a one-sided mirror-finished wafer, and a two-sided mirror-finished wafer, which has undergone either known etching or mirror finish polishing for achieving the prescribed planarity, and is capable of realizing extremely high-precision planarity with a two-side mirror-finished wafer.

In the present invention, the oxygen concentration and carbon concentration are increased to promote the generation of BMD and the like, which is an oxygen precipitate. In other words, it causes the degradation of the integrity of a [wafer] surface and near surface. However, because the high-temperature $H_2$ environment of an epitaxial growth treatment process greatly reduces, by roughly 1 order of magnitude or more according to SIMS analysis, the oxygen concentration required to grow these BMD in a region between several μm and several tens of μm from the wafer surface, the environment that enables the generation of BMD is eliminated, and an effect that annihilates BMD is achieved, thus preventing the degradation of the integrity of the [wafer] surface and near surface.

In the first invention, the range of the oxygen concentration Oi is limited to $12\sim27\times10^{17}$ atoms/cm$^3$ (OLD ASTM method). It was ascertained that there are also wafers that exhibit a gettering effect even with an oxygen concentration in the vicinity of Oi $0.5\times10^{17}$ atoms/cm$^3$ in accordance with combining with the carbon concentration Cs content, but with a view also toward reliability and stable repeatability, [oxygen concentration] was set at over $12\times10^{17}$ atoms/cm$^3$, and the upper limit was set at $27\times10^{17}$ atoms/cm$^3$, which is the maximum value that can be incorporated into a silicon single crystal.

Further, the range of the carbon concentration Cs is limited to $0.5\sim32\times10^{16}$ atoms/cm$^3$ (NEW ASTM method). It was ascertained that there are also wafers that exhibit a gettering effect even with a carbon concentration in the vicinity of Cs $0.3\times10^{16}$ atoms/cm$^3$ in accordance with combining with the oxygen concentration Oi, but with a view also toward reliability and stable repeatability, [carbon concentration] was set at over $0.5\times10^{16}$ atoms/cm$^3$, and the upper limit was set at $32\times10^{16}$ atoms/cm$^3$, which is the maximum value that can be incorporated into silicon.

In the second invention, the range of the oxygen concentration is limited to $12\sim18\times10^{17}$ atoms/cm$^3$. The inventors ascertained that there are also wafers that exhibit a gettering effect even with an oxygen concentration in the vicinity of $11\times10^{17}$ atoms/cm$^3$ in accordance with combining with the carbon content, and the implementation of low-temperature annealing for a long duration, but with a view also toward reliability, stable repeatability, and productivity, the [oxygen concentration] lower limit was set at $12\times10^{17}$ atoms/cm$^3$. Further, with regard to the upper limit of $18\times10^{17}$ atoms/cm$^3$, although there are no problems even in the vicinity of $27\times10^{17}$ atoms/cm$^3$, for example, which is the maximum value that can be incorporated into a silicon single crystal, $18\times10^{17}$ atoms/cm$^3$ was set as the upper limit for reasons of control stability when pulling a silicon single crystal, ready modification and applicability to other types of products, and the fact that it is the upper limit specification utilized for substrates for ordinary semiconductor devices.

Further, the range of the carbon concentration Cs is limited to $0.3\times10^{16}$ atoms/cm$^3$~$2.5\times10^{16}$ atoms/cm$^3$. The inventors ascertained that there are also wafers that exhibit a gettering effect even with [a carbon concentration] in the vicinity of $0.2 \times 10^{16}$ atoms/cm$^3$ in accordance with combining with the oxygen content, and the implementation of low-temperature annealing for a long duration, but with a view also toward reliability, stable repeatability, and productivity, the lower limit of [carbon concentration] was set at Cs $0.3 \times 10^{16}$ atoms/cm$^3$.

With regard to the Cs upper limit of $2.5 \times 10^{16}$ atoms/cm$^3$, there are no problems, for example, even in the vicinity of Cs $32 \times 10^{16}$ atoms/cm$^3$, which is the maximum value that can be incorporated into a silicon single crystal. But because the segregation coefficient of carbon is an extremely small 0.07, when pulling a silicon single crystal, the value of the initially-pulled portion (top) differs by as much as 3-to 5-fold with that of the latter stage (bottom side), the value of the carbon concentration in general, and when the value of the bottom side is extremely large, for example, Cs $15 \times 10^{16}$ atoms/cm$^3$ or Cs $25 \times 10^{16}$ atoms/cm$^3$, it is a known fact that a break will occur part way along a crystallographic axis when pulling a silicon single crystal, and [the silicon] is not pulled as a single crystal. It is recognized that pulling yield will be reduced as a result thereof, and further, due to the fact that there is no significant difference in the subsequent gettering effect between when the carbon concentration is set at $10 \times 10^{16}$ atoms/cm$^3$, and when it is set at $2.5 \times 10^{16}$ atoms/cm$^3$, the upper limit was set at Cs $2.5 \times 10^{16}$ atoms/cm$^3$.

Further, with regard to the annealing temperature for the present invention, as is known from classical nucleation theory, and from experiment results using various standard samples, temperatures up to 600° C. are not desirable because a long duration heat treatment is required to grow oxygen precipitate nuclei large enough that the effects of the heat history of an epitaxial growth process will not shrink the size of the BMD nuclei. Conversely, temperatures in excess of 900° C. are too hot, sufficiently dense oxygen precipitate nuclei are not generated, and the effect thereof is not achieved. [The temperature] is thus set at more than 600° C. and less than 900° C.

As for annealing time, because annealing of at least more than 15 minutes is required to achieve a BMD of over $3 \times 10^8$[/cm$^3$], a sufficient density for gettering even in low-temperature processing at the above-described temperature conditions, the lower limit was set thereat, and the upper limit was set at 4 hours because that is the time required to achieve sufficient density for gettering when using the respective minimum values for the above-described oxygen concentration and carbon concentration, and because longer than that is not desirable when productivity is taken into consideration.

Furthermore, the resistivity value of the silicon wafer that constitutes the epi-wafer substrate is not limited in particular, but as described above, for highly-integrated devices typified by D-RAM, N-IG, which relies on PBS, BSD and other EG, or DZ-IG are utilized on the substrates therefor, and most of these substrates have a resistivity value of over 0.1 Ω·cm. Further, since a gettering deficiency resulting from epitaxial growth occurs in a substrate of over 0.1 Ω·cm like this, the effect of the method of the present invention for a silicon wafer with a resistivity value larger than that described above is remarkable. Furthermore, the [resistivity value] upper limit utilized for these substrates differs in accordance with the device, and is around several tens of Ω·cm, and since a significant difference in gettering capabilities is not apparent at 0.1 Ω·cm and several tens of Ω·cm, no particular upper limit is established.

Conversely, with regard to [a resistivity value] of less than 0.1 Ω·cm, ultra-low resistance substrates, designed mainly for the latch-up effect, have been utilized for some time as epi-wafer substrates, and the value thereof, for example, is around 0.004~0.013 Ω·cm. And for a p-type single crystal, to which B (boron) has been added, oxygen precipitation is abnormally promoted by the effect of the high concentration of B, so that even the thermal history of an epitaxial growth process has no effect, pre-epitaxial growth annealing at low temperatures is not performed, the forming of sufficient BMD necessary for gettering in a low-temperature process means IG deficiency is not a problem, and the method of the present invention can be suitably applied as needed.

Embodiments

Embodiment 1

B (boron) was added when growing an 8-inch diameter silicon single crystal using the CZ method, and a silicon single crystal, having the various characteristics of a substrate resistivity value ps of 0.004~0.010[Ω·cm], an oxygen concentration Oi of 8.4~22[$\times 10^{17}$ atoms/cm$^3$], and a carbon concentration Cs of 0.1~20[$\times 10^{16}$ atoms/cm$^3$], was grown.

Figure 1:
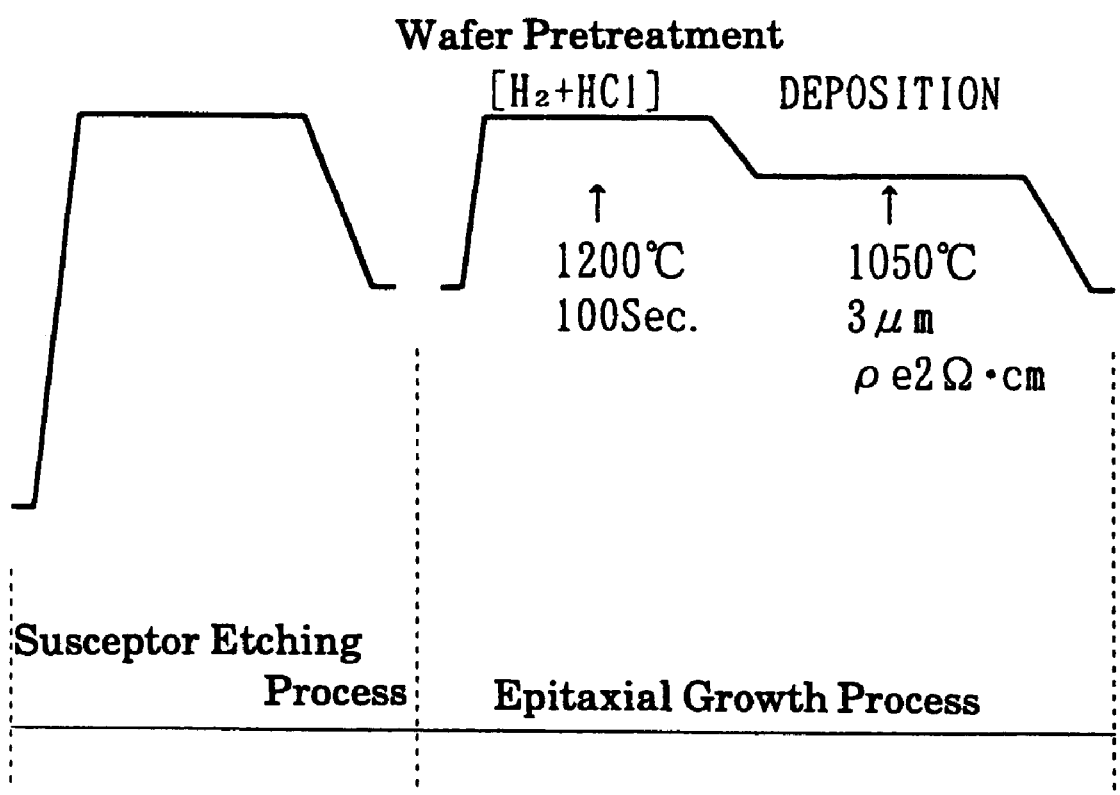
FIG. 1 is a heat pattern diagram showing the epitaxial growth treatment process.

After growing a 3 μm epitaxial layer via the epitaxial growth process shown in FIG. 1 on a one-side mirror-finished wafer, which utilized this silicon single crystal to process a wafer having EG, which was subjected to a 5000 Å PBS growth treatment on the backside, and on 2 standard samples that were mirror-finished on two sides, a spin coater was used to quantitatively dope the front side of the wafer with roughly $1 \times 10^{12}$ atoms/cm$^2$ each of Ni, Fe, and Cu elements separately, after which the impurities were diffused inside the wafer by a heat treatment at 1000° C. for 60 minutes. Then, after preparing each of the standard samples, which were not doped in any way, [the wafers] were subjected to simulated heat treatments equivalent to device processing. The implemented heat treatment pattern is shown in FIG. 2.

After applying an oxide layer (250 Å) to these samples, and preparing a Poly-Si electrode MOS, the oxide layer breakdown voltage was measured. [This measurement] is a typical procedure for evaluating electrical characteristics, and readily reflects the correspondence with characteristic yields in actual device processing. In this oxide layer breakdown voltage characteristics evaluation, device processing was also deemed to be problem free for a sample, for which the percentage of the yield exceeded 70%. Examples of experiment results are shown in FIG. 3~FIG. 6.

Furthermore, setting the dopant at $1 \times 10^{12}$ atoms/cm$^2$ here was decided based on the fact that, as mentioned above, device manufacturers are also striving to improve the degree of in-process cleanness, and the amount of impurities generated has been reduced considerably compared to what it was in the past, and in view of the results obtained via evaluations and the like at a plurality of device manufacturers, the upper limit of the amount of process generated impurities at present is $1 \times 10^{12}$ atoms/cm$^2$. Similarly, with regard to impurity elements, the probability of the above-mentioned 3 elements being generated is clearly high, and [impurities] were limited to these 3 elements.

Figure 2:
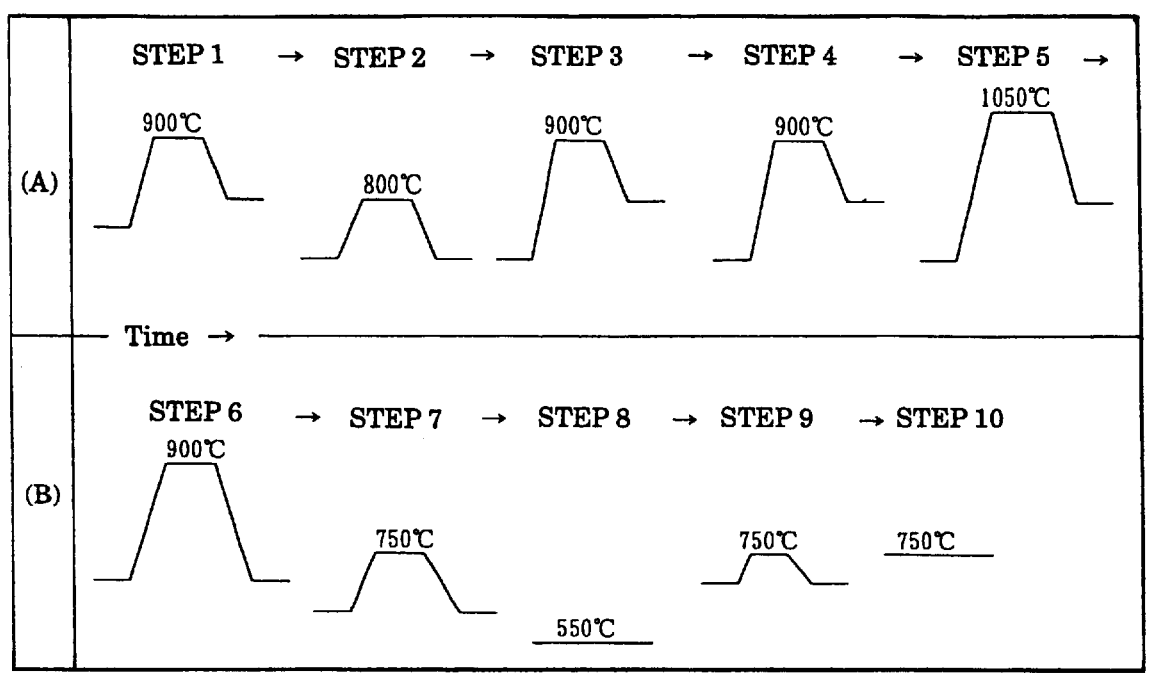
FIG. 2 is a heat pattern diagram showing heat treatments equivalent to device processing.

FIG. 3, FIG. 4, FIG. 5 and FIG. 6 depict the relationship between the oxygen concentration Oi for each carbon concentration Cs level and the percentage of the Yield at the oxide layer breakdown voltage characteristics evaluation for samples, which, after having an epitaxial layer (pretreatment conditions: 1200° C./100 sec, DEPOSITION conditions: 3 μm·pepi2 Ω·cm at 1050° C.) grown on each of the EG-furnished one-side mirror-finished wafer, and two-side mirror-finished wafer samples, were doped using Ni elements, and were subjected to the low-temperature device processing-equivalent simulation heat treatment of FIG. 2.

Figure 3:
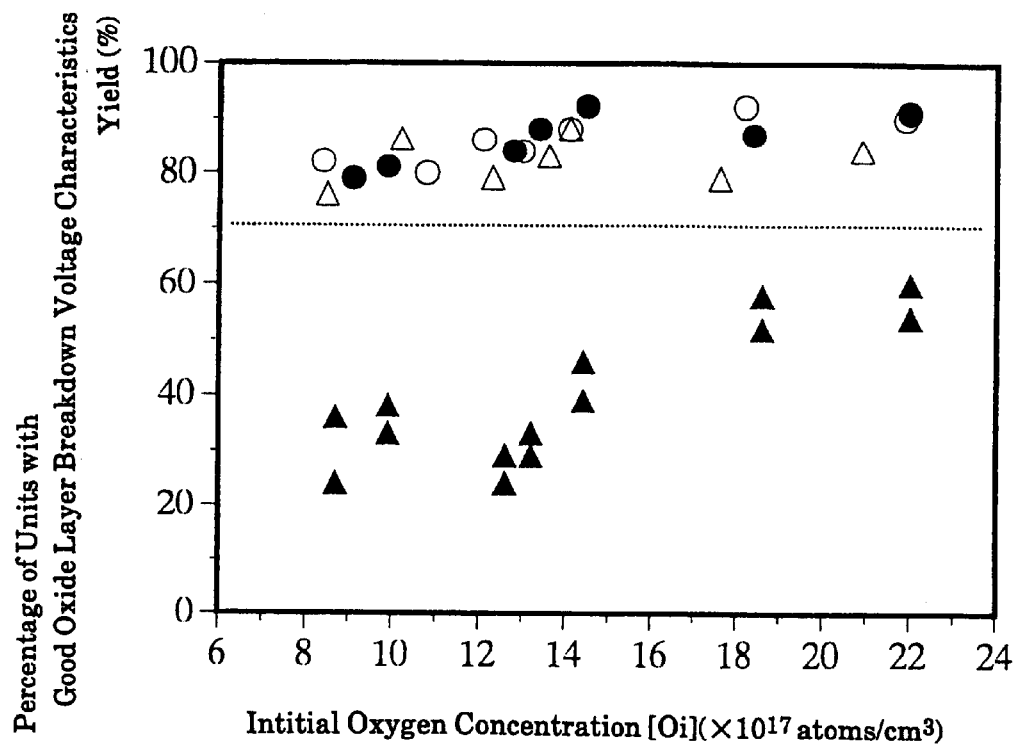
FIG. 3 is a graph showing the relationship between the initial oxygen concentration Oi and the percentage of units with good oxide layer breakdown voltage characteristics Yield when doping is performed using Ni elements and the heat treatment of FIG. 2 is performed, and depicts a case when the carbon concentration is less than Cs $0.1 \times 10^{16}$ atoms/cm$^3$. The circles in the figure represent one-side mirror-finished wafers subjected to EG, and the triangles represent two-side mirror-finished wafers not subjected to EG, with white symbols (both circles and triangles) indicating no dopant, and black ones indicating dopant.

As for a silicon single crystal pulled for use as prime wafers, for some time now the carbon concentration Cs level has generally been held down and reduced as much as possible during pulling to make the silicon highly pure. Consequently, the carbon concentration Cs contained in a wafer is at a level less than $0.1 \times 10^{16}$ atoms/cm$^3$, which is the minimum detectable limit value of measurement equipment. FIG. 3 shows an example of the relationship between the oxygen concentration Oi and percentage of good units Yield when using a sample, for which the carbon concentration Cs level is less than $0.1 \times 10^{16}$ atoms/cm$^3$.

In the case of a one-side mirror-finished wafer that has undergone EG processing, it was shown that the percentage of the Yield was high for all samples, from those with low oxygen concentration Oi to those with high oxygen concentration Oi, regardless of the difference associated with whether or not [the sample] was subjected to Ni doping. It is believed that since a PBS treatment process, which makes impurity gettering capabilities possible, was performed on the backside of the wafer, the impurity elements were gettered thereat.

Conversely, in the case of a two-side mirror-finished wafer that has not undergone EG processing, it was shown that the percentage of good units Yield was high, from those [samples] with low oxygen concentration Oi to those with high oxygen concentration Oi, when there was no doping. However, when doping was performed, the percentage of the Yield was seen to decline, and this tendency conspicuously emerges when the oxygen concentration of the wafer is lowered. In this case, it is believed that the oxygen precipitate nuclei, which function as the gettering capabilities, could not capture all of the impurities because the amount of gettering capabilities thereof is small for a low oxygen concentration Oi sample.

Figure 4:
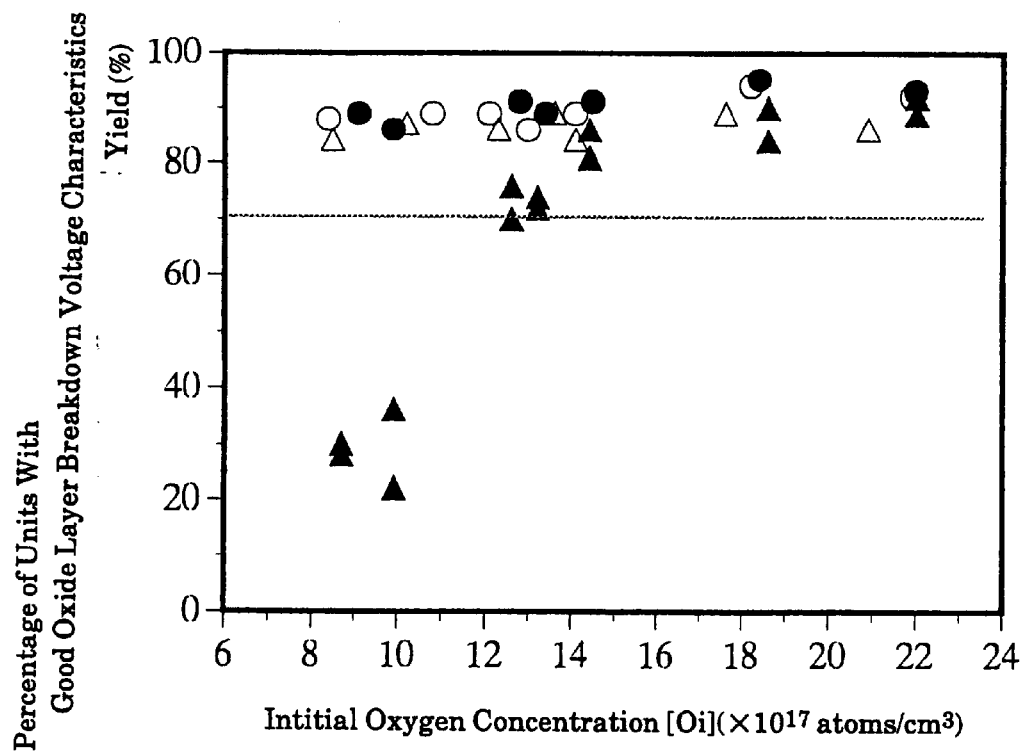
FIG. 4 is a graph showing the relationship between the initial oxygen concentration Oi and the percentage of units with good oxide layer breakdown voltage characteristics Yield when doping is performed using Ni elements and the heat treatment of FIG. 2 is performed, and depicts a case when the carbon concentration is Cs $0.5 \times 10^{16}$ atoms/cm$^3$. The circles in the figure represent one-side mirror-finished wafers subjected to EG, and the triangles represent two-side mirror-finished wafers not subjected to EG, with white symbols (both circles and triangles) indicating no dopant, and black ones indicating dopant.
Figure 5:
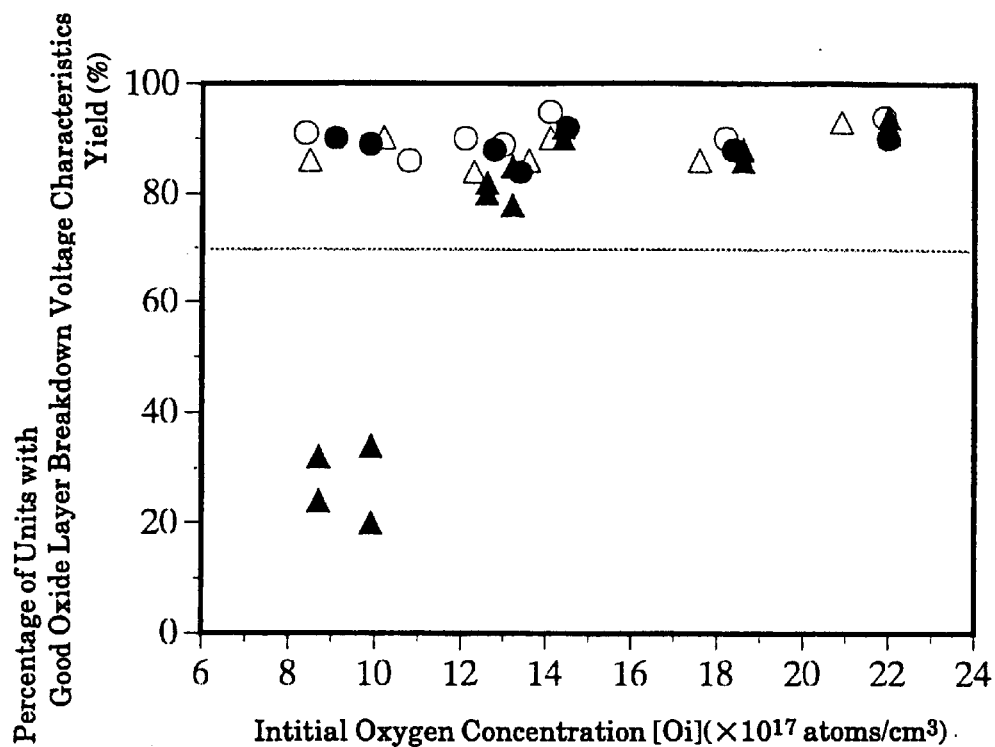
FIG. 5 is a graph showing the relationship between the initial oxygen concentration Oi and the percentage of units with good oxide layer breakdown voltage characteristics Yield when doping is performed using Ni elements and the heat treatment of FIG. 2 is performed, and depicts a case when the carbon concentration is Cs $5.0 \times 10^{16}$ atoms/cm$^3$. The circles in the figure represent one-side mirror-finished wafers subjected to EG, and the triangles represent two-side mirror-finished wafers not subjected to EG, with white symbols (both circles and triangles) indicating no dopant, and black ones indicating dopant.
Figure 6:
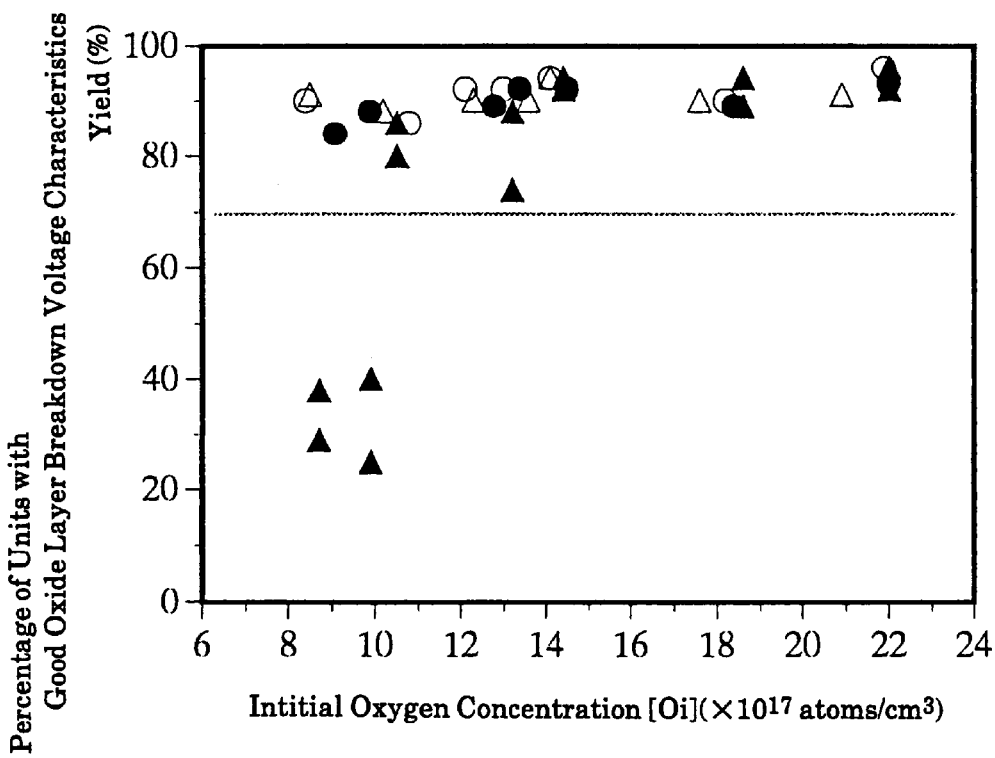
FIG. 6 is a graph showing the relationship between the initial oxygen concentration Oi and the percentage of units with good oxide layer breakdown voltage characteristics Yield when doping is performed using Ni elements and the heat treatment of FIG. 2 is performed, and depicts a case when the carbon concentration is Cs $20 \times 10^{16}$ atoms/cm$^3$. The circles in the figure represent one-side mirror-finished wafers subjected to EG, and the triangles represent two-side mirror-finished wafers not subjected to EG, with white symbols (both circles and triangles) indicating no dopant, and black ones indicating dopant.

FIG. 4, FIG. 5 and FIG. 6 show the results of research on the relationship between oxygen concentration Oi and the percentage of good units Yield when using samples, for which the respective Cs content is controlled to 0.5, 5 and $20 \times 10^{16}$ atoms/cm$^3$.

For a one-sided mirror-finished wafer that has gettering capabilities on the backside, it was shown that the results are the same as when the above-mentioned carbon concentration is less than Cs $0.1 \times 10^{16}$ atoms/cm$^3$, and that the percentage of the Yield is high, regardless of whether or not there is doping.

Further, for a two-sided mirror-finished wafer as well, it was ascertained that the percentage of good units Yield is high when there is no doping, regardless of the difference in the level of carbon concentration Cs. Conversely, when doping was performed, it was ascertained that, in accordance with using samples in which the level of the oxygen concentration Oi and carbon concentration Cs was controlled, a percentage of the Yield equal to that of a one-sided mirror-finished wafer having gettering capabilities on the backside is exhibited, and the reduction of the percentage of the Yield can be held in check.

Embodiment 2

Figure 7:
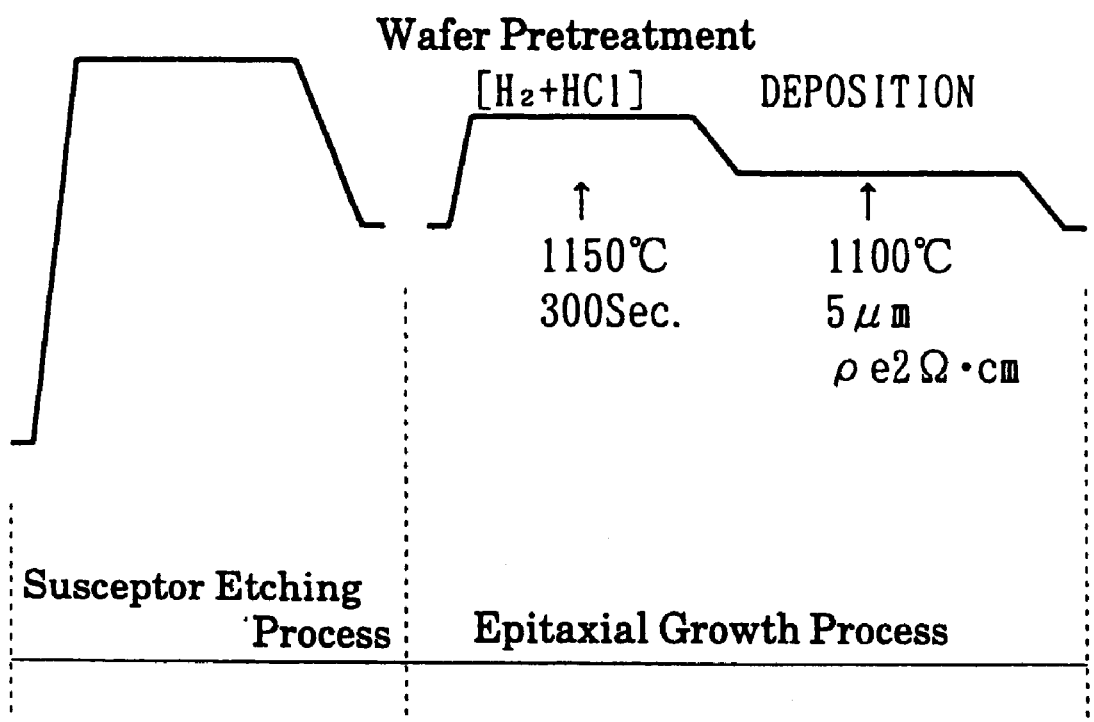
FIG. 7 is another heat pattern diagram showing the epitaxial growth treatment process.
Figure 8:
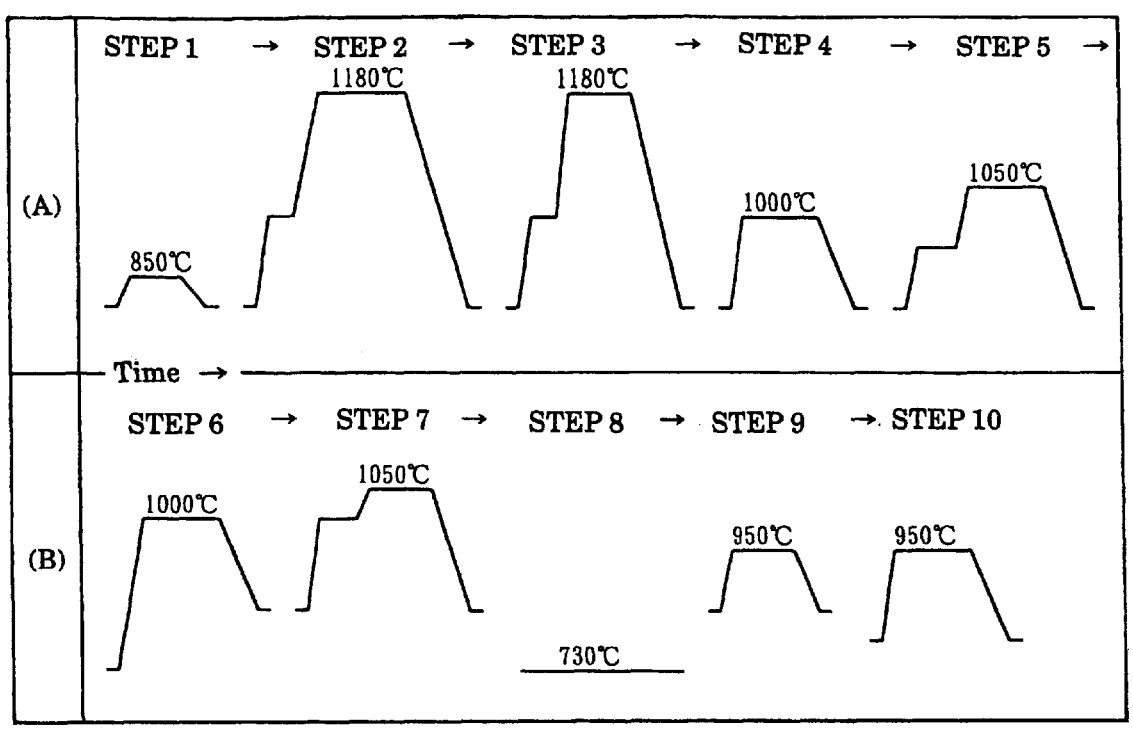
FIG. 8 is another heat pattern diagram showing heat treatments equivalent to device processing.

Boron was added when growing an 8-inch diameter silicon single crystal via the CZ method, and a silicon single crystal, having the characteristics of a substrate resistivity value ps of 1.0~2.5[Ω·cm], an oxygen concentration Oi of 10~22[$\times 10^{17}$ atoms/cm$^3$], and a carbon concentration Cs of 0.1~20[$\times 10^{16}$ atoms/cm$^3$], was prepared. After using this silicon single crystal to prepare a one-sided mirror-finished wafer, which had not been subjected to any EG treatment process on the backside, and growing a 5 μm epitaxial layer via the process shown in FIG. 7, a sample, which was subjected to doping using a procedure similar to that of Embodiment 1, and 2 standard samples, which were not subjected to doping, were prepared, respectively, following which, [the samples] were subjected to simulated heat treatments equivalent to device processing. The implemented heat treatment pattern is shown in FIG. 8. Further, the oxide layer breakdown voltage for these samples was measured via the same method as that of Embodiment 1. FIG. 9~FIG. 12 show examples of the experimental results thereof.

FIG. 9, FIG. 10, FIG. 11, and FIG. 12 show the relationship between the oxygen concentration Oi for each carbon concentration Cs level and the percentage of good units Yield at the oxide layer breakdown voltage characteristics evaluation for samples, which, after having an epitaxial layer (pretreatment conditions: 1150° C./300 sec, DEPOSITION (deposition) conditions: 5 μm·pepi2 Ω·cm at 1100° C.) grown on a one-side mirror-finished wafer not subjected to an EG treatment, were doped with Cu elements, and were subjected to the low-temperature device processing-equivalent simulation heat treatment of FIG. 8.

Figure 9:
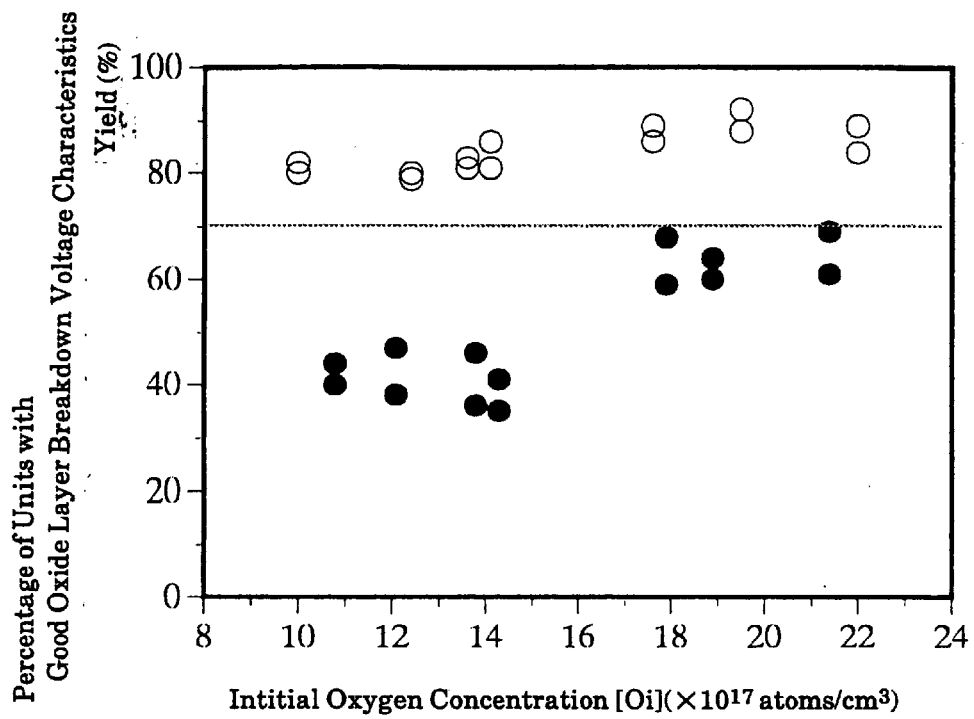
FIG. 9 is a graph showing the relationship between the initial oxygen concentration Oi and the percentage of units with good oxide layer breakdown voltage characteristics Yield when doping is performed using Cu elements and the heat treatment of FIG. 8 is performed, and depicts a case when the carbon concentration is less than Cs $0.1 \times 10^{16}$ atoms/cm$^3$. The circles in the figure represent one-side mirror-finished wafers not subjected to EG, with white circles indicating no dopant, and black ones indicating dopant.

FIG. 9 shows an example of the relationship between oxygen concentration Oi and the percentage of good units Yield when using a sample, for which the carbon concentration Cs level is less than $0.1 \times 10^{16}$ atoms/cm$^3$. For samples not subjected to Cu doping, it was shown that the percentage of good units Yield is high for all [samples], from the low oxygen concentration samples to high oxygen concentration samples. However, for samples subjected to Cu doping, the percentage of good units Yield is greatly reduced compared to that of undoped samples. It was shown that this tendency is conspicuous for samples on the low oxygen concentration Oi side, in particular.

This signifies that there is a relation to the oxygen precipitate nuclei that exist in a wafer. That is, the oxygen precipitate nuclei that possess the function for capturing impurities exist in greater numbers in a sample on the high oxygen concentration Oi side than in a sample on the low oxygen concentration Oi side. This difference in the quantity of oxygen precipitate nuclei is reflected in the amount of impurity elements capable of being captured, and it is believed that as a result thereof the extent of reduction in the percentage of good units Yield was less for samples on the high oxygen concentration Oi side than for samples on the low oxygen concentration Oi side.

Figure 10:
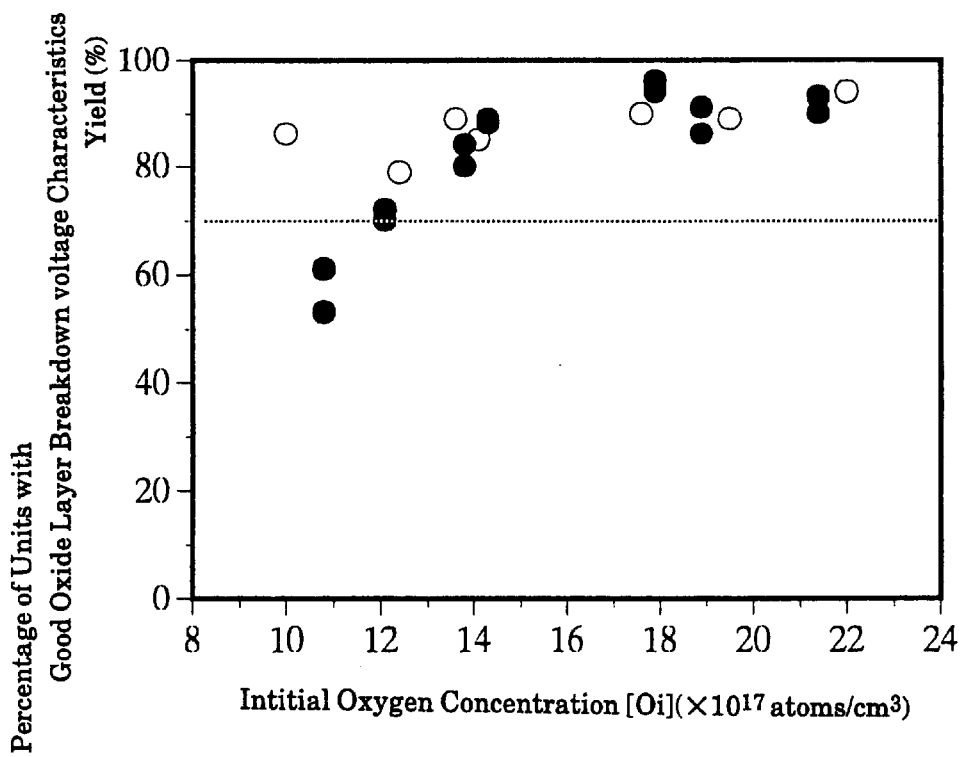
FIG. 10 is a graph showing the relationship between the initial oxygen concentration Oi and the percentage of units with good oxide layer breakdown voltage characteristics Yield when doping is performed using Cu elements and the heat treatment of FIG. 8 is performed, and depicts a case when the carbon concentration is Cs $0.5 \times 10^{16}$ atoms/cm$^3$. The circles in the figure represent one-side mirror-finished wafers not subjected to EG, with white circles indicating no dopant, and black ones indicating dopant.
Figure 11:
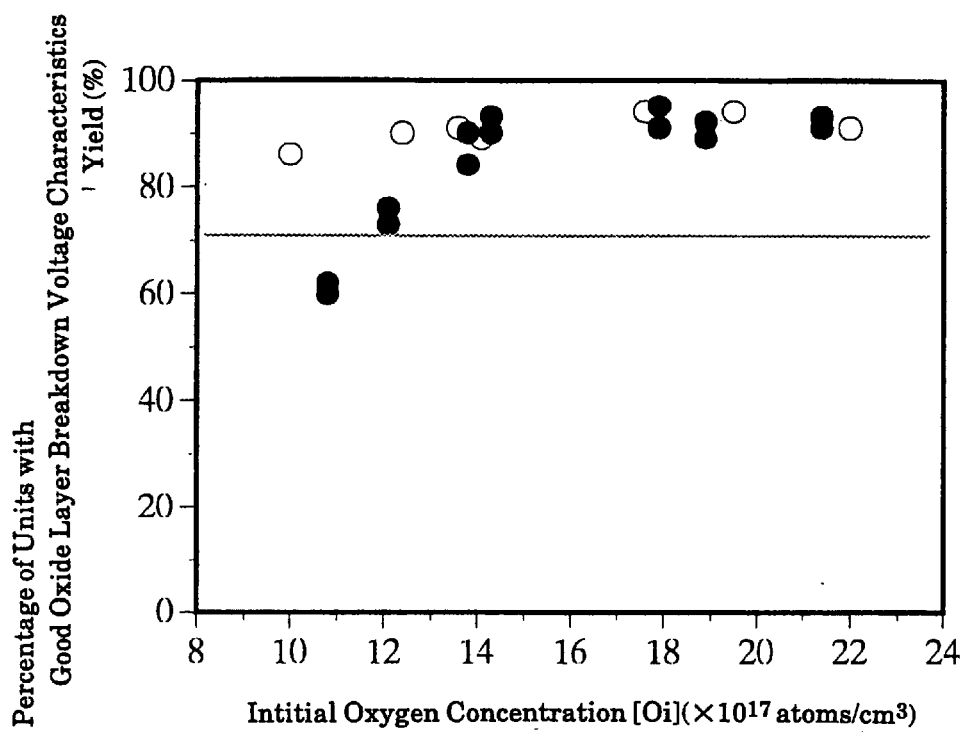
FIG. 11 is a graph showing the relationship between the initial oxygen concentration Oi and the percentage of units with good oxide layer breakdown voltage characteristics Yield when doping is performed using Cu elements and the heat treatment of FIG. 8 is performed, and depicts a case when the carbon concentration is Cs $5.0 \times 10^{16}$ atoms/cm$^3$. The circles in the figure represent one-side mirror-finished wafers not subjected to EG, with white circles indicating no dopant, and black ones indicating dopant.
Figure 12:
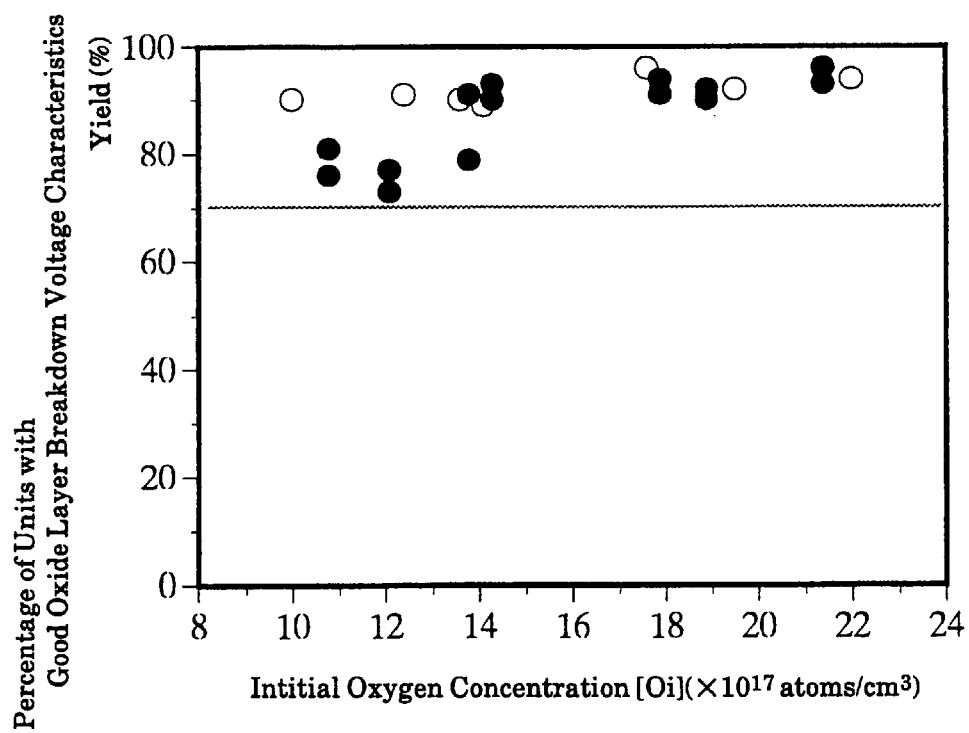
FIG. 12 is a graph showing the relationship between the initial oxygen concentration Oi and the percentage of units with good oxide layer breakdown voltage characteristics Yield when doping is performed using Cu elements and the heat treatment of FIG. 8 is performed, and depicts a case when the carbon concentration is Cs $20 \times 10^{16}$ atoms/cm$^3$. The circles in the figure represent one-side mirror-finished wafers not subjected to EG, with white circles indicating no dopant, and black ones indicating dopant.

FIG. 10, FIG. 11, and FIG. 12 show the results of research on the relationship between oxygen concentration Oi and the percentage of good units Yield when using samples, for which the level of carbon concentration Cs was controlled to $0.5 \times 10^{16}$ atoms/cm$^3$, $5.0 \times 10^{16}$ atoms/cm$^3$, and $20 \times 10^{16}$ atoms/cm$^3$, respectively. For samples, which were not subjected to doping, oxide layer breakdown voltage characteristics were high for all sample levels, regardless of the difference between the oxygen concentration Oi level and the carbon concentration Cs level, and no degradation was observed. Conversely, for samples subjected to doping, a reduction in the percentage of good units Yield was observed on the low oxygen concentration Oi side, compared to when there was no doping. However, these reductions in the percentage of good units Yield ceased to be observed in line with the heightening of the oxygen concentration Oi and the heightening of the carbon concentration Cs.

This is believed to be the result of the oxygen precipitate nuclei, which possess the function for capturing impurity elements, increasing in line with the heightening of the level of the oxygen concentration Oi, as described above, and similarly, of the effect, whereby the heightening of the carbon concentration Cs enables the promotion of the generation and growth of oxygen precipitate nuclei, and of the combination of these 2, oxygen concentration Oi and carbon concentration Cs, promoting gettering functions. Therefore, to prevent the reduction of the percentage of good units Yield, as described above, it is necessary to cause to a certain extent the high-density generation of oxygen precipitate nuclei via the combination of oxygen concentration Oi and carbon concentration Cs.

Figure 13:
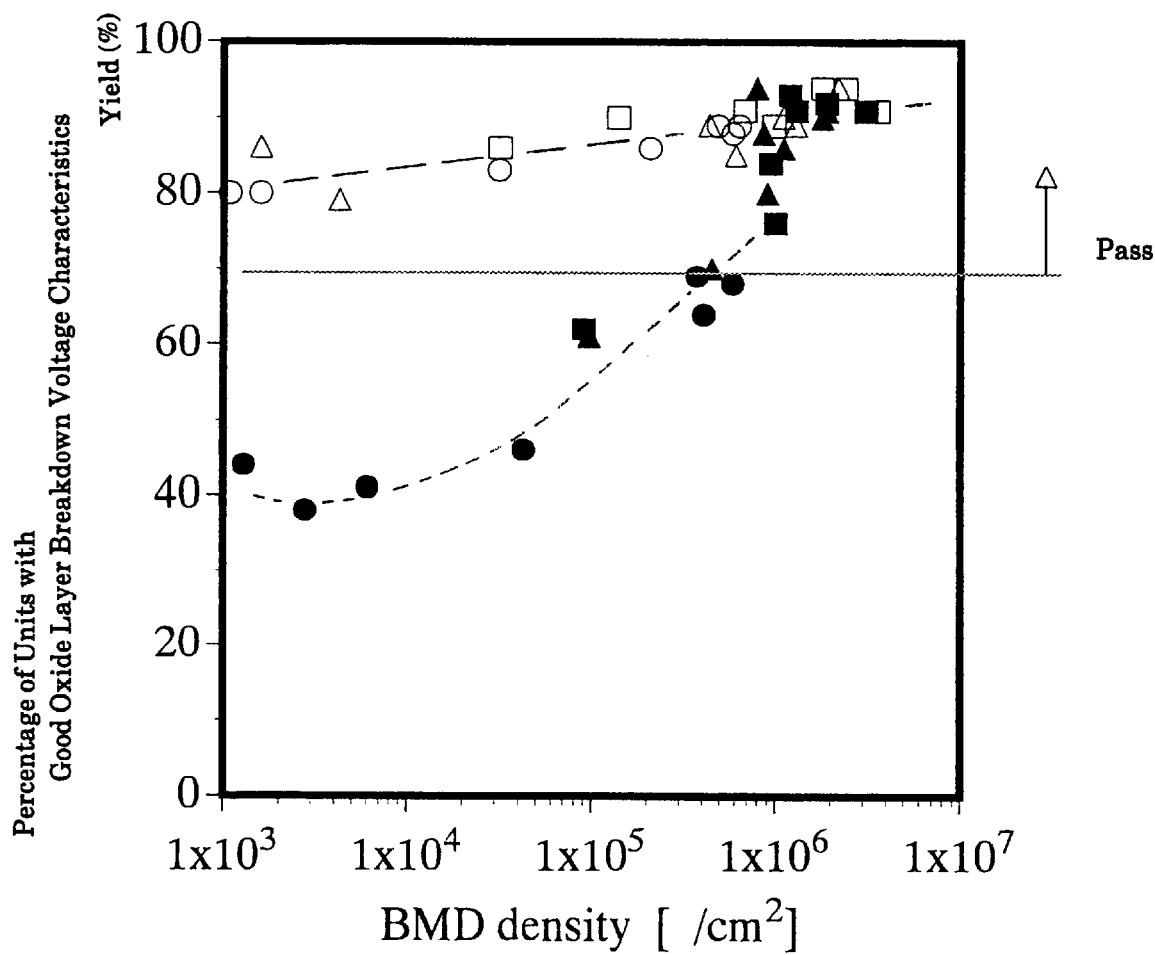
FIG. 13 is a graph showing the relationship between BMD density and the percentage of units with good oxide layer breakdown voltage characteristics Yield, the circles in the figure represent less than Cs $0.1 \times 10^{16}$ atoms/cm$^3$, the triangles represent Cs $0.5 \times 10^{16}$ atoms/cm$^3$, and the squares represent Cs $20 \times 10^{16}$ atoms/cm$^3$, with white symbols (circles, triangles and squares) indicating no dopant, and black ones indicating dopant.
Figure 14:
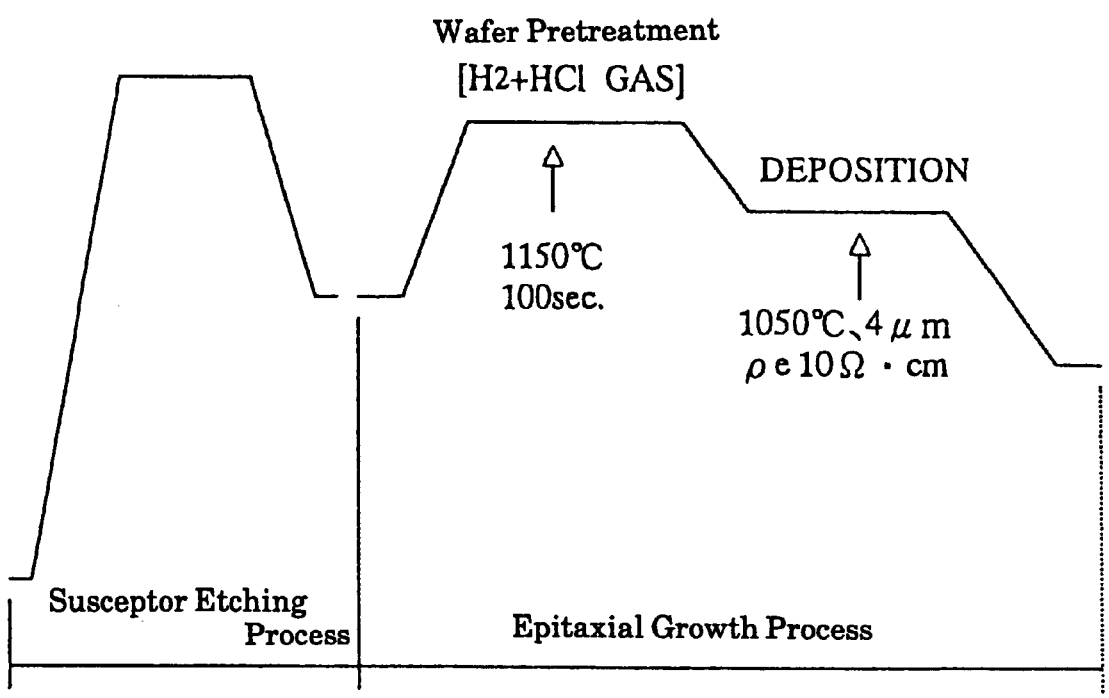
FIG. 14 is a heat pattern diagram showing an epitaxial growth treatment process.

FIG. 13 illustrates an example of the relationship between oxide layer breakdown voltage characteristics and crystalline characteristics (internal BMD density). After cleaving the various samples described above into rectangular shapes, a 1(m etching process was performed using a selective etching solution (Wright solution), and the density of BMD and other crystal defects actualized thereby was measured using an optical microscope.

[FIG. 13] illustrates the relation between the percentage of units with good oxide layer breakdown voltage characteristics Yield and internal BMD density in accordance with the presence or absence of doping for all samples, which had carbon concentrations Cs of less than $0.1\times10^{16}$ atoms/cm$^3$, $0.5\times10^{16}$ atoms/cm$^3$, and $20\times10^{16}$ atoms/cm$^3$, and differing oxygen concentrations Oi. As a result thereof, for samples not subjected to doping, the percentage of good units Yield is good regardless of the extent of BMD density. Conversely, for samples subjected to doping, a strong correlation with BMD density was observed, and it was ascertained that even in cases were impurities exist, it is possible to prevent the reduction of the percentage of good units Yield by using samples, for which oxygen concentration Oi and carbon concentration Cs were controlled, and internal BMD density is not less than consistent.

Embodiment 3

B (boron) was added when growing a 6-inch diameter silicon single crystal via the CZ method, and silicon wafers were sliced from the silicon single crystal, which was pulled by controlling the substrate resistivity value at 7~10 Ω·cm, and the oxygen concentration to 11, 12, 14, 15, 16, 18 and $19\times10^{17}$ atoms/cm$^3$, respectively. After growing a 4 μm epitaxial layer on these substrates via the epitaxial growth process shown in FIG. 4, a simulation heat treatment equivalent to low-temperature device processing was implemented. The implemented heat treatment pattern is shown in FIG. 15.

Figure 16:
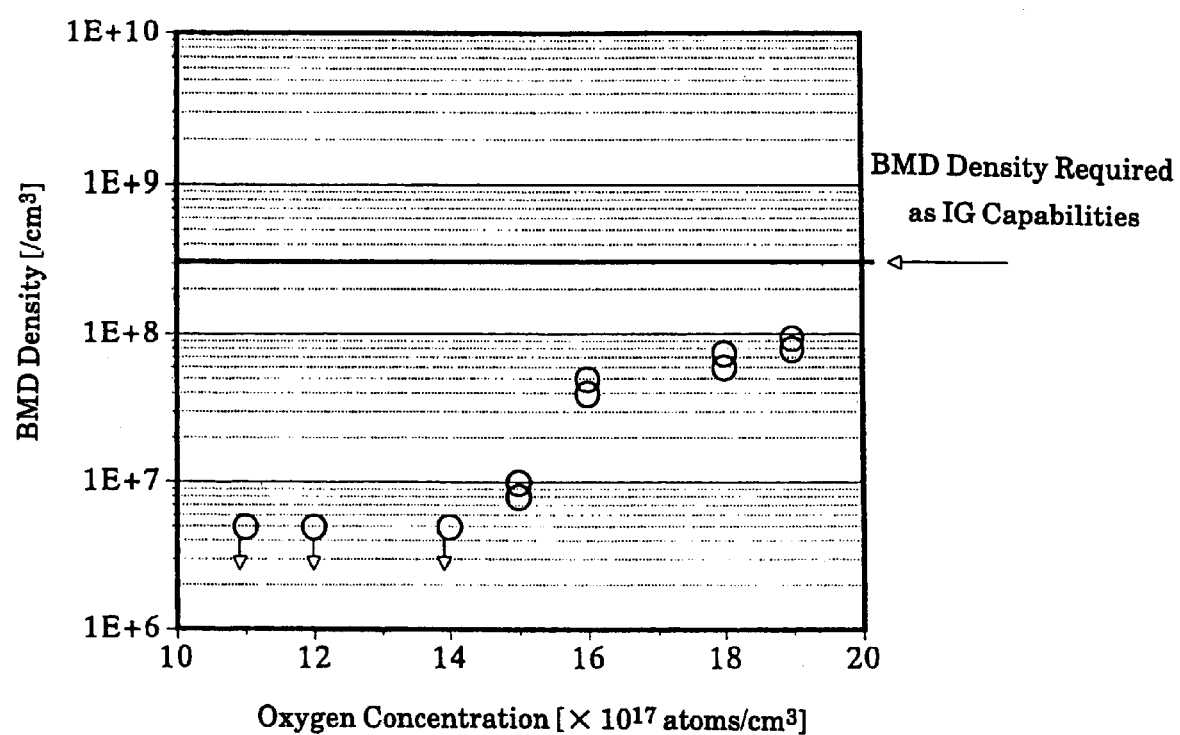
FIG. 16 is a graph showing the relationship between oxygen concentration and BMD density following low-temperature processing heat treatment, and depicts a case when the carbon concentration is less than the minimum detectable limit of $0.1 \times 10^{16}$ atoms/cm$^3$.

After cleaving these samples into rectangular shapes, a 2.0 μm etching process was performed on one side using a selective etching solution (Wright solution), and the density of BMD and other crystal defects actualized thereby was measured using an optical microscope. FIG. 16 shows the results thereof.

As shown in FIG. 16, an increase in BMD density is observed as the oxygen concentration of the silicon wafers constituting the substrates rises. However, the $3\times10^8$[/cm$^3$] BMD density required as IG capabilities is not achieved even when, for example, the oxygen concentration is $19\times10^{17}$ atoms/cm$^3$, confirming that the desired BMD density cannot be achieved simply by raising the oxygen concentration.

Furthermore, the reason for setting the BMD density required for IG capabilities at $3\times10^8$[/cm$^3$] here is that this is the density indicated from the results of carrying out post-epitaxial growth spin coater doping using Fe, Ni, and Cu elements, and thereafter, implementing under several conditions simulation heat treatment equivalent to low-temperature device processing, studying the measured BMD density, and oxide layer breakdown voltage characteristics and generation lifetime characteristics resulting from MOS C-t, and analyzing the respective correlations thereof.

Silicon wafers sliced from a silicon single crystal, which was pulled in accordance with the above-described specifications, were subjected to low-temperature annealing within a temperature range of 550~950° C. for between 4~12 hours, followed by mirror finish polishing, after which, epitaxial growth was used to grow an epitaxial layer, an etching process was performed, and BMD density was measured. The results thereof are shown in FIG. 17.

Figure 17:
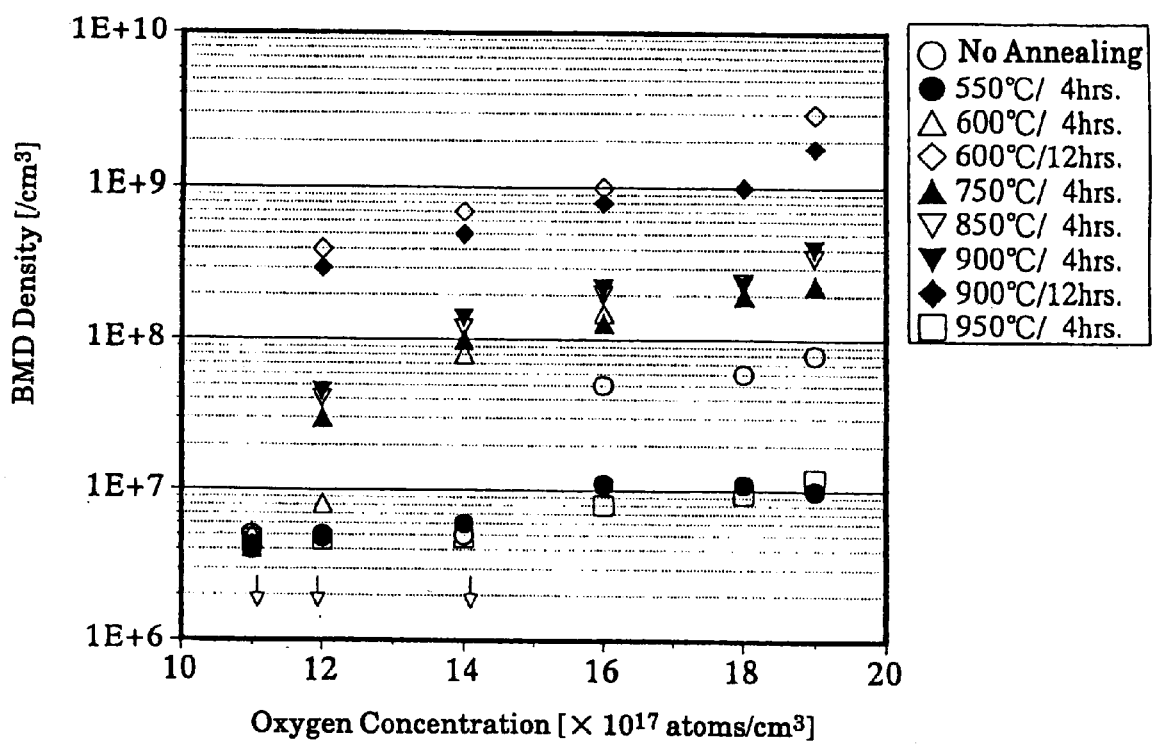
FIG. 17 is a graph showing the relationship between oxygen concentration and BMD density following low-temperature processing heat treatment, when a substrate has been subjected to various low-temperature annealing, and depicts a case when the carbon concentration is less than the minimum detectable limit of $0.1 \times 10^{16}$ atoms/cm$^3$.

As shown in FIG. 17, very little increase in BMD density is observed even in high oxygen concentration samples subjected to low-temperature heat treatment for 4 hours under conditions of 550° C. and 950° C. It can be inferred, that under these temperature conditions, not much of an increase in the density thereof can be achieved even if subjected to further [heat treatment] for a long duration (for example, 12 hours).

Conversely, when low-temperature annealing is performed for 4 hours under temperature conditions of 600~900° C., it is possible to ascertain an increase in BMD density compared to situation of FIG. 16 described above, in which there was no low-temperature annealing. However, it was learned that, with the exception of a portion of the high oxygen concentration samples, the desired BMD was not achieved, and the desired IG capabilities could not be realized using low-temperature annealing alone.

Further, when long-duration 12-hour annealing was performed, it was possible to achieve the desired BMD density with a substrate oxygen concentration of $12\times10^{17}$ atoms/cm$^3$ or higher. But when cost-savings and productivity are taken into consideration, a long-duration heat treatment like this is not suitable.

Similarly, it was also ascertained that when oxygen concentration is less than $12\times10^{17}$ atoms/cm$^3$, no increase in BMD density is observed even when low-temperature heat treatment is performed at various temperatures for various durations.

Embodiment 4

Figure 18:
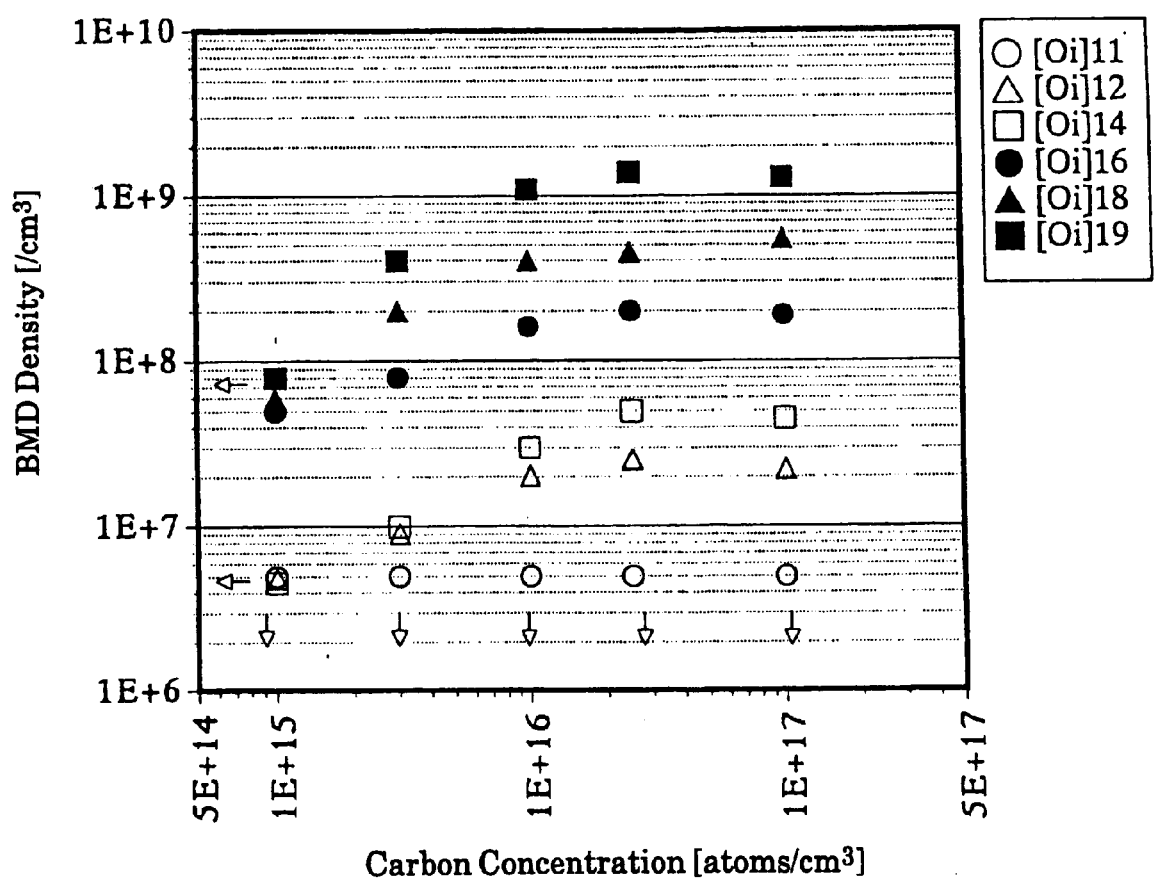
FIG. 18 is a graph showing the relationship between carbon concentration, oxygen concentration, and BMD density following low-temperature processing heat treatment.

Boron was added when growing a 6-inch diameter silicon single crystal via the CZ method, and silicon wafers were sliced from the silicon single crystal, which was pulled by controlling the substrate resistivity value at 7~10 Ω·cm, the oxygen concentration to 11, 12, 14, 16, 18 and $19\times10^{17}$ atoms/cm$^3$, and the carbon concentration to less than the FTIR minimum detectable limit value of $0.1\times10^{16}$ atoms/cm$^3$, $0.3\times10^{16}$ atoms/cm$^3$, $1.0\times10^{16}$ atoms/cm$^3$, $2.5\times10^{16}$ atoms/cm$^3$, and $0.1\times10^{17}$ atoms/cm$^3$, respectively. After growing a 4μm epitaxial layer on these substrates via the epitaxial growth process shown in FIG. 4, the low-temperature device processing-equivalent simulation heat treatment of FIG. 15 was implemented. The results thereof are shown in FIG. 18.

The results of processing simulation heat treatment showed that BMD density increased as the oxygen concentration increased. But, due to the fact that an increase thereof was not observed even when an equivalent amount of carbon was added when the oxygen concentration was $11\times10^{17}$ atoms/cm$^3$, it was also ascertained that unless the oxygen concentration is $12\times10^{17}$ atoms/cm$^3$ or higher, no matter how much the carbon concentration is increased, [the carbon] does not function to assist or promote oxygen precipitation.

As shown in Embodiment 2 described above, silicon wafers with various differing carbon concentrations were sliced, and various low-temperature short-duration annealing was performed, a mirror finish was applied, an epitaxial layer was grown, and low-temperature device processing-equivalent heat treatment was carried out, following which changes in BMD density were studied. Examples thereof are provided in Table 1 and Table 2.

In Table 1, a silicon wafer, to which carbon was added to make the concentration $0.3\times10^{16}$ atoms/cm$^3$, was subjected to heat treatment at 900° C. for different lengths of time, and BMD behavior was studied.

Similarly, in Table 2, a silicon wafer with a carbon concentration of $2.5\times10^{16}$ atoms/cm$^3$ was subjected to heat treatment at 600° C. for different lengths of time, and BMD behavior was studied.

From the results thereof, it was discovered that combining an oxygen concentration and a carbon concentration with values of more than $12\times10^{17}$ atoms/cm$^3$ and more than $0.3\times10^{16}$ atoms/cm$^3$, respectively, and subjecting the sliced wafers to low-temperature annealing at temperatures between 600~900° C. for a duration of 15 minutes or longer, made it possible to achieve the BMD of $3\times10^8$[/cm$^3$] or higher required for IG capabilities.

TABLE 1

| Oxygen concentration ×10$^{17}$ atoms/cm$^3$ | BMD[cm$^3$] | | | |
|---|---|---|---|---|
| | No annealing | 900° C./ 5 min | 900° C./ 15 min | 900° C./ 4 hours |
| 11 | $5.0 \times 10^6$ | $5.0 \times 10^6$ | $5.0 \times 10^6$ | $5.0 \times 10^6$ |
| 12 | $9.0 \times 10^6$ | $9.0 \times 10^6$ | $4.0 \times 10^8$ | $1.0 \times 10^9$ |
| 14 | $1.3 \times 10^7$ | $1.2 \times 10^7$ | $6.0 \times 10^8$ | $1.5 \times 10^9$ |
| 16 | $8.0 \times 10^7$ | $1.8 \times 10^8$ | $1.4 \times 10^9$ | $3.0 \times 10^9$ |

TABLE 2

| Oxygen concentration ×10$^{17}$ atoms/cm$^3$ | BMD[cm$^3$] | | | |
|---|---|---|---|---|
| | No annealing | 600° C./ 5 min | 600° C./ 15 min | 600° C./ 4 hours |
| 11 | $5.0 \times 10^6$ | $5.0 \times 10^6$ | $5.0 \times 10^6$ | $5.0 \times 10^6$ |
| 12 | $2.5 \times 10^7$ | $3.0 \times 10^7$ | $4.0 \times 10^8$ | $1.9 \times 10^9$ |
| 14 | $5.0 \times 10^7$ | $2.5 \times 10^8$ | $6.9 \times 10^8$ | $2.9 \times 10^9$ |
| 16 | $2.0 \times 10^8$ | $3.8 \times 10^8$ | $1.8 \times 10^9$ | $4.2 \times 10^9$ |

It was ascertained that implementing low-temperature annealing at between 600~900° C. for a duration of 15 minutes or longer under the aboved-mentioned scope and conditions, creates an environment in which, when the oxygen concentration is $12\times10^{17}$ atoms/cm$^3$ or higher, large number of oxygen precipitate nuclei are scattered about, and BMD are readily grown, and making the carbon concentration $0.3\times10^{16}$ atoms/cm$^3$ at the same time, enhances an effect, which assists or promotes these oxygen precipitate nuclei. Furthermore, the size of the oxygen precipitate nuclei increase in accordance with performing low-temperature annealing on these silicon wafers, and [these nuclei] are not annihilated during the epitaxial growth process, and, in accordance with this combination, sufficient IG capabilities BMD) required for gettering can be achieved even when [these silicon wafers ] are subjected to low-temperature device processing following epitaxial growth.

Furthermore, only p-type (B) embodiments are described here, but it has been ascertained that the same effect can be achieved with regard to n-type as well.
Embodiment 5

Figure 19:
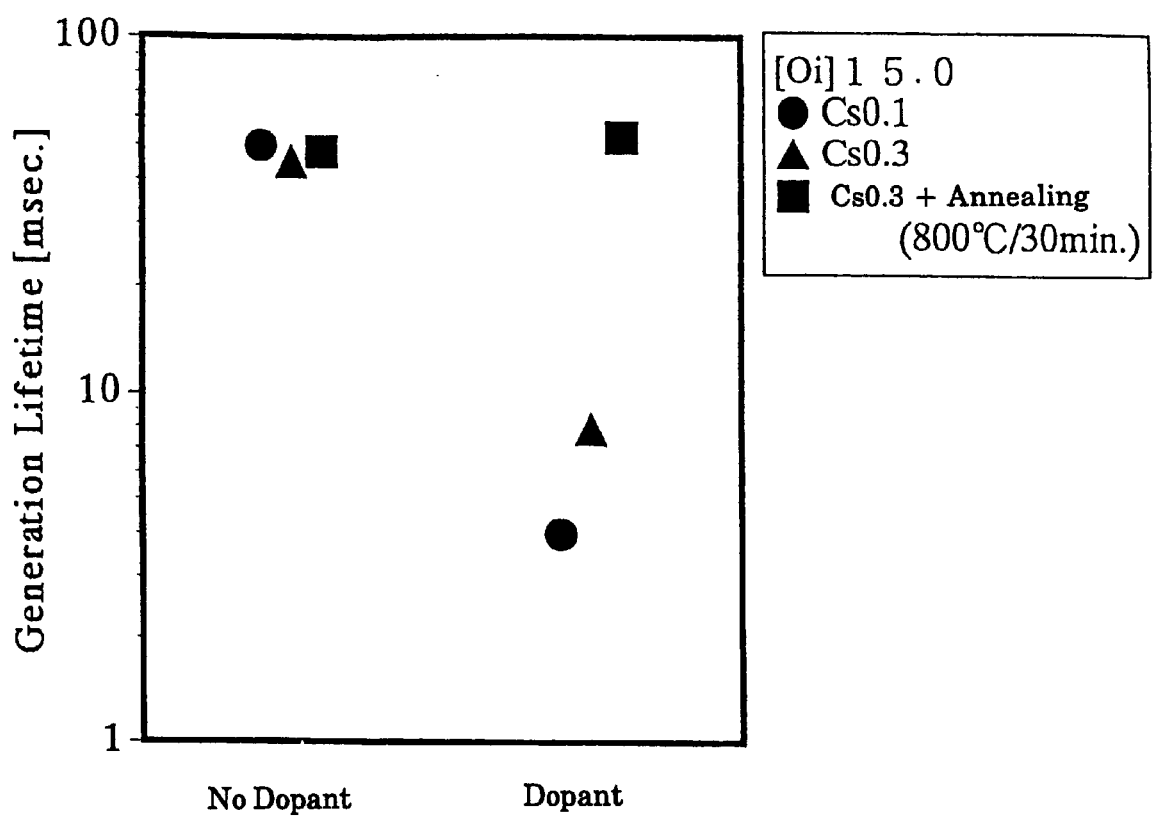
FIG. 19 is a graph showing the relationship between generation lifetime in accordance with Ni element impurities, the carbon concentration of the substrate, and the presence or absence of low-temperature annealing conditions.

Further, Three(3) standard samples were prepared with an oxygen concentration of $15\times10^{17}$ atoms/cm$^3$, and respective carbon concentrations of less than the limit of detection of $0.1\times10^{16}$ atoms/cm$^3$, $0.3\times10^{16}$ atoms/cm$^3$, and $0.3\times10^{16}$ atoms/cm$^3$ annealed at 800° C. for 30 minutes. After undergoing epitaxial growth, and being intentionally doped with nickel (Ni: $1\times10^{12}$ atoms/cm$^2$) using the spin coater method, [these samples] were subjected to the same low-temperature processing heat treatment, following which generation lifetime was measured using MOS C-t. The results thereof are shown in FIG. 19.

When there is no doping, the 3 standard samples each exhibit a high lifetime. Conversely, when doping is performed, it was ascertained that the sample, to which carbon concentration was intentionally added, and which underwent low-temperature annealing, shows no change in value, but the other 2 standard samples exhibit a considerable reduction in lifetime. From this it can be inferred that the BMD density for gettering impurities increases in accordance with the addition of carbon concentration+low-temperature annealing, and as a result thereof, lifetime is maintained. That is, it is an example, in which an electrical characteristics evaluation also confirmed the fact that the present invention introduces a sufficient IG effect into low-temperature processing. Further, the same effects was also confirmed with Fe and Cu.
Industrial Applicability The present invention, in addition to furnishing gettering capabilities in accordance with suitably controlling the pulling of a silicon single crystal using the CZ method to [achieve] a relatively high oxygen concentration, and an intentionally high carbon concentration, respectively, strives to lower costs by reducing the number of processes in accordance with not performing any type of EG treatment carried out after conventional wafering, and as shown in the embodiments, can grant to an epi-wafer, which has not undergone any EG processing whatsoever, heretofore unachievable gettering capabilities for impurities generated during device processing.

Further, the present invention, in addition to furnishing gettering capabilities (IG) in accordance with performing annealing for a short duration at a low temperature following suitably controlling oxygen concentration, and carbon concentration while pulling a silicon single crystal using the CZ method, and slicing silicon wafers, makes it possible to reduce the number of processes and strives to lower costs in accordance with not performing any type of complex EG treatment carried out after conventional wafer formation, and as shown in the embodiments, in accordance with making possible the heretofore unachievable granting of gettering capabilities [for impurities] generated during device processing that utilizes an epi-wafer, makes it possible to manufacture a substrate capable of dealing [with measures] for enhancing precision because EG is not needed even when two-side mirror finish polishing is required to realize high-precision planarity in large diameter wafers of 12 inches or more.

Further, compared to that exhibited by prior art, [the present invention] can greatly reduce the duration of annealing implemented either after epitaxial growth or prior thereto, and in accordance with the implementation thereof prior to epitaxial growth, for which the frequency of defect generation is low, makes it possible to manufacture at low cost a silicon epi-wafer that has few processing defects.

What is claimed is:

1. A silicon epitaxial wafer, which is a silicon single crystal grown via the CZ method, and doped with either boron or phosphorous; which has an oxygen concentration in the range of $12\sim27\times10^{17}$ atoms/cm$^3$ (OLD ASTM method), and a carbon concentration in the range of $0.5\sim32\times10^{16}$ atoms/cm$^3$ (NEW ASTM 80 method); and which is polished to a mirror finish on one side or two sides, and has an epitaxial layer grown on a surface of the wafer, which has not been subjected to any process from which an EG effect can be anticipated.

2. A silicon epitaxial wafer, which is a silicon single crystal grown via the CZ method, and doped with either boron or phosphorous; which has an oxygen concentration in the range of $12\sim18\times10^{17}$ atoms/cm$^3$, and a carbon concentration in the range of $0.5\sim2.5\times10^{16}$ atoms/cm$^3$; and which is polished to a mirror finish on one side or two sides, has an epitaxial layer grown on a surface of the wafer, which has not been subjected to any process from which an EG effect can be anticipated, and has a resistivity value of $0.1\Omega\cdot$cm or greater.

3. A silicon epitaxial wafer manufacturing method, wherein, after slicing a silicon wafer from a single-crystal ingot of silicon pulled by controlling the oxygen concentration within the silicon single crystal in the range of $12\sim27\times10^{17}$ atoms/cm$^3$, and the carbon concentration in the range of $0.5\sim32\times10^{16}$ atoms/cm$^3$ during pulling via the CZ method, one side or two sides of the wafer are polished to a mirror finish, and further, an epitaxial layer is grown via a gas-phase growth method on a prescribed surface, without performing a process from which an EG effect can be anticipated.

4. A silicon epitaxial wafer manufacturing method, wherein, after slicing into a silicon wafer a silicon single crystal pulled via the CZ method by controlling the oxygen concentration in the range of $12\sim18\times10^{17}$ atoms/cm$^3$, and the carbon concentration in the range of $0.5\sim2.5\times10^{16}$ atoms/cm$^3$, short-duration annealing is performed at a temperature of between 600° C. and 900° C. under conditions of between 15 minutes and 4 hours, one side or two sides of the wafer are polished to a mirror finish, and an epitaxial layer is grown on a surface thereof, without performing any process from which an EG effect can be anticipated.

* * * * *

UNITED STATES PATENT AND TRADEMARK OFFICE
Certificate

Patent No. 6,277,501 B1

Patented: August 21, 2001

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Takashi Fujikawa, Kashima, Japan; and Naoki Ikeda, Sagaken, Japan.

Signed and Sealed this Fifth Day of October 2004.

DEBORAH JONES
*Supervisory Patent Examiner*
Art Unit 1775